(12) United States Patent
Xu et al.

(10) Patent No.: US 10,128,832 B2
(45) Date of Patent: Nov. 13, 2018

(54) CONVERTER SYSTEM, DRIVING CIRCUIT AND METHOD FOR SEMICONDUCTOR SWITCH

(71) Applicant: DELTA ELECTRONICS, INC., Taoyuan Hsien, Taiwan (CN)

(72) Inventors: Lizhi Xu, Taiwan (CN); Weiyi Feng, Taiwan (CN); Weiqiang Zhang, Taiwan (CN); Hongyang Wu, Taiwan (CN)

(73) Assignee: DELTA ELECTRONICS, INC., Taoyuan Hsien, Taiwan (CN)

( * ) Notice: Subject to any disclaimer, the term of this patent is extended or adjusted under 35 U.S.C. 154(b) by 0 days.

(21) Appl. No.: 14/856,869

(22) Filed: Sep. 17, 2015

(65) Prior Publication Data

US 2016/0226479 A1     Aug. 4, 2016

(30) Foreign Application Priority Data

Jan. 30, 2015   (CN) .......................... 2015 1 0049603

(51) Int. Cl.
*H03K 17/56* (2006.01)
*H02M 1/08* (2006.01)
*H02M 7/487* (2007.01)
*H03K 17/16* (2006.01)

(52) U.S. Cl.
CPC .............. *H03K 17/56* (2013.01); *H02M 1/08* (2013.01); *H03K 17/166* (2013.01); *H02M 7/487* (2013.01)

(58) Field of Classification Search
CPC ............ H02M 1/00; H02M 1/08; H02M 7/00; H02M 7/487; H03K 17/00; H03K 17/04126; H03K 17/063; H03K 17/0826; H03K 17/166; H03K 17/56; H03K 17/601; H03K 2217/00; H03K 2217/0036

USPC .......................................................... 327/109
See application file for complete search history.

(56) References Cited

U.S. PATENT DOCUMENTS 5,926,012 A      7/1999   Takizawa et al.
2015/0372671 A1* 12/2015  Akahane ............ H03K 17/0828
                                                361/18

FOREIGN PATENT DOCUMENTS

| CN | 1588799 A    | 3/2005  |
| CN | 101820276 A  | 9/2010  |
| EP | 2811648 A1   | 12/2014 |
| JP | 10023743 A   | 1/1998  |
| JP | 2006332952 A | 12/2006 |
| JP | 2008289048 A | 11/2008 |

(Continued)

OTHER PUBLICATIONS

1st OA issued Nov. 29, 2016 by the JP Office.

(Continued)

*Primary Examiner* — Lincoln Donovan
*Assistant Examiner* — David Mattison
(74) *Attorney, Agent, or Firm* — Yunling Ren

(57) ABSTRACT

The present application discloses a converter system, a driving circuit and a driving method for a semiconductor switch. The driving circuit includes a driving unit, a sampling unit and a selection unit. A plurality of turn-off driving units with different turn-off parameters is provided in the driving unit, and a turn-off driving unit having a turn-off parameter adaptive to the working state of the semiconductor switch is selected according to the working state of the semiconductor switch so as to turn off the semiconductor switch.

11 Claims, 18 Drawing Sheets

(56) References Cited

FOREIGN PATENT DOCUMENTS

| JP | 2014045598 A | 3/2014 |
| JP | 2014150696 A | 8/2014 |
| WO | 2014171278 A1 | 10/2014 |

OTHER PUBLICATIONS

The extended European search report dated Jun. 20, 2016 by the EP Office.
Cited Article:Closed-Loop IGBT Gate Drive Featuring Highly Dynamic di/dt and dv/dt Control.
The 1st office action issued in the counterpart CN application No. 201510049603.5 dated Feb. 24, 2018, by the SIPO.
The Second OA issued by CNIPA dated Sep. 13, 2018.

\* cited by examiner

CONVERTER SYSTEM, DRIVING CIRCUIT AND METHOD FOR SEMICONDUCTOR SWITCH

This application is based upon and claims priority to Chinese Patent Application No. 201510049603.5, filed on Jan. 30, 2015, the entire contents of which are incorporated herein by reference.

TECHNICAL FIELD

The present disclosure relates to a driving circuit and a driving method for driving a semiconductor switch.

BACKGROUND

Semiconductor switches have been widely used for power converters in recent years, such as Insulated Gate Bipolar Transistor (IGBT), Metal-Oxide-Semiconductor Field-Effect Transistor (MOSFET), SiC MOSFET and the like. However, a high percentage of the losses in the power converters come from the losses of the semiconductor switches.

The losses of the semiconductor switches include switching losses and conduction losses. The switching losses are related to the characters of driving circuits for the semiconductor switches and the switching frequency of the semiconductor switches. Therefore, different driving circuits using the semiconductor switches may cause different switching losses of the semiconductor switches.

Taking IGBT as an example, a common IGBT driving circuit is shown in FIG. 1. The driving circuit includes a first resistor R1, a first switching device Q1, a second switching device Q3 and a driving resistor $R_d$. After receiving a driving control signal DS, the first resistor R1 transmits the driving control signal DS to a totem-pole amplifier composed of the first switching device Q1 and the second switching device Q3. The amplified signal output from the totem-pole amplifier turns on or off the IGBT S by passing through the driving resistor $R_d$. FIGS. 2A and 2B show a relationship between the resistance of the driving resistor $R_d$ and the turn-off loss Eoff of the IGBT S and a relationship between the resistance of the driving resistor $R_d$ and the turn-on loss Eon of the IGBT S, respectively. It may be seen from the FIGS. 2A and 2B that with the decrease of the resistance of the driving resistor $R_d$, the switching speed is increased, and the turn-off loss Eoff and the turn-on loss Eon fall down accordingly. Therefore, smaller resistance of the driving resistor $R_d$ may decrease the switching loss of the IGBT.

However, in actual circuit application, the resistance of the driving resistor $R_d$ is limited by voltage stress. FIG. 3 shows a half-bridge circuit comprising IGBTs. An inverter system is formed by an LC filter, a first capacitor C1 and a second capacitor C2, which converts DC voltages across the first capacitor C1 and the second capacitor C2 connected in series at the DC side into an alternating current (AC) output voltage Vout. Ls1 and Ls2 in the figure are parasitic inductors in the main loop. When IGBT S1 is turned off, because of current continuity of the output inductor Lf, the current flowing through the IGBT S1 before is transferred to the current flowing through a diode $D_2$ in anti-parallel with an IGBT S2 for freewheeling. During this process, voltages $V_{Ls1}$ and $V_{Ls2}$ are formed in the parasitic inductors Ls1 and Ls2 by the di/dt of the currents flowing through the IGBT S1 and the anti-parallelled diode $D_2$, wherein $V_{Ls1}=Ls1 \cdot di/dt$, and $V_{Ls2}=Ls2 \cdot di/dt$. The voltage stress of the IGBT S1 at this moment is $V_{S1}=V_{C1}+V_{C2}+(Ls1+Ls2) \cdot di/dt$. A relationship between the voltage stress $V_{S1}$ and the resistance of the driving resistor $R_d$ is shown in FIG. 4. It can be seen from FIG. 4 that the smaller the resistance of the driving resistor $R_d$ or the larger the current is, the larger the switching speed (didt) will be, thereby causing a larger voltage stress.

In FIG. 4, if the limit value of the voltage stress $V_{S1}$ is 550V and the minimum turn-off current of the IGBT is 300 A, the minimum resistance of the driving resistor $R_d$ may be 10Ω. However, it can be seen from FIGS. 2A and 2B that the Eoff and Eon when the resistance of the driving resistor $R_d$ is 10Ω are much larger than the Eoff and Eon when the resistance of the driving resistor $R_d$ is 2.5Ω, and thus the IGBT has a larger switching loss.

As mentioned above, there are contradictions between obtaining a smaller IGBT switching loss and obtaining a smaller IGBT voltage stress in a converter system. A prior scheme of a driving circuit is shown in FIG. 5. This circuit can make a driving resistor $R_d$ as a turn-on resistor $R_{d1}$ for turning on the IGBT and a driving resistor $R_d$ as a turn-off resistor $R_{d2}$ for turning off the IGBT. The driving circuit may obtain smaller turn-on resistance ($R_{d1}/R_{s2}$) with the larger turn-off resistance. However, even if the turn-on loss of the IGBT may be decreased by employing the circuit, the turn-off loss of the IGBT still cannot be decreased. Therefore, the system still has a higher switching loss.

Accordingly, a driving circuit and its method is highly required to overcome the foregoing defects.

SUMMARY

In order to overcome all or a part of problems in related arts, the present disclosure provides a driving circuit for a semiconductor switch, a driving method for a semiconductor switch and a converter system using the driving circuit for a semiconductor switch, so as to overcome, to some extent, one or more problems caused by the limitations and defects in related arts.

Other properties and advantages of the present disclosure will become clear through the following detailed description, or may be learned partially by the practice of the present disclosure.

According to a first aspect of the present disclosure, there is provided a driving circuit for a semiconductor switch, including:

a driving unit comprising a plurality of turn-off driving units with different turn-off parameters and a turn-on driving unit;

a sampling unit configured to sample a sampling current reflecting a working state of the semiconductor switch; and a selection unit receiving a driving control signal, the sampling current and one or more reference values, determining the working state of the semiconductor switch according to the sampling current and the reference values when the driving control signal is a first control signal, and selecting a turn-off driving unit with a turn-off parameter adaptive to the working state to turn off the semiconductor switch; and selecting the turn-on driving unit to turn on the semiconductor switch when the driving control signal is a second control signal.

According to a second aspect of the present disclosure, there is provided a driving method for driving a semiconductor switch. The method employs a driving circuit including a plurality of turn-off driving units with different turn-off parameters and a turn-on driving unit.

The method includes the following steps of:

sampling a sampling current reflecting a working state of the semiconductor switch; and receiving a driving control signal and one or more reference values, when the driving control signal is a first control signal, determining the working state of the semiconductor switch according to the sampling current and the reference values, and selecting a turn-off driving unit with a turn-off parameter adaptive to the determined working state to turn off the semiconductor switch; and when the driving control signal is a second control signal, selecting the turn-on driving unit to switch on the semiconductor switch.

In the embodiments of the present disclosure, a plurality of turn-off driving units having different turn-off parameters are provided and the working state of the semiconductor switch is acquired, so that a turn-off driving unit having a turn-off parameter adaptive to the working state of the semiconductor switch is selected according to the working state of the semiconductor switch so as to turn off the semiconductor switch. In this way, a relatively small switching loss may be obtained and the system efficiency may be improved on one hand; on the other hand, the security character of the system may be improved and the reliability of the system may be increased.

BRIEF DESCRIPTION OF THE DRAWINGS

The embodiments of the present invention will described in detail with reference to drawings, in which.

DETAILED DESCRIPTION

Figure 1:
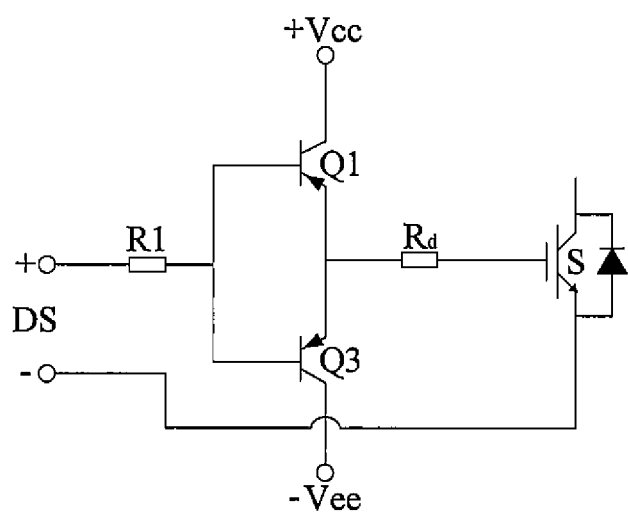
FIG. 1 is block diagram showing a structure of an IGBT driving circuit in related arts.
Figure 2A:
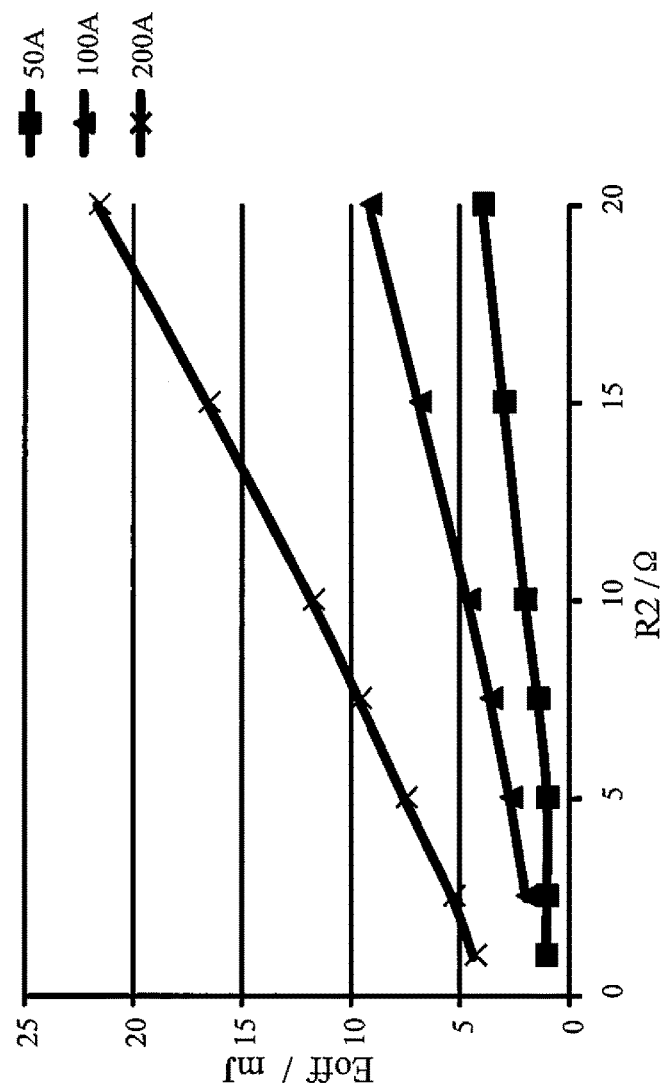
FIG. 2A is a graph showing a relationship between the driving resistance and a turn-off loss of the IGBT driving circuit in FIG. 1.
Figure 2B:
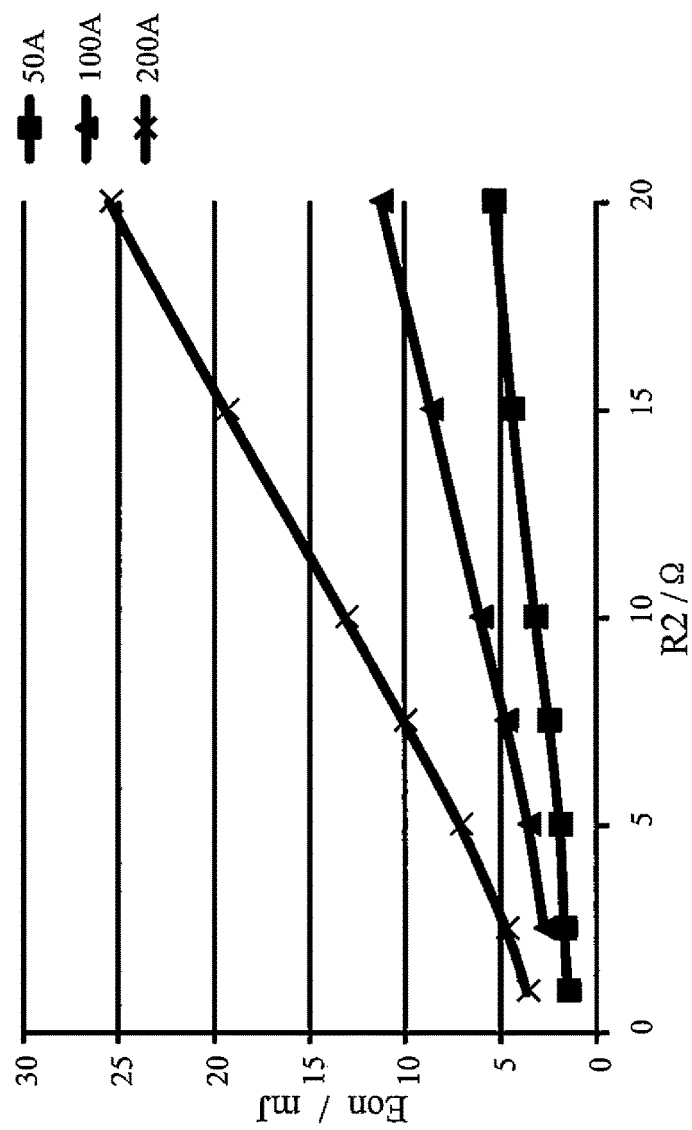
FIG. 2B is a graph showing a relationship between the driving resistance and a turn-on loss of the IGBT driving circuit in FIG. 1.
Figure 3:
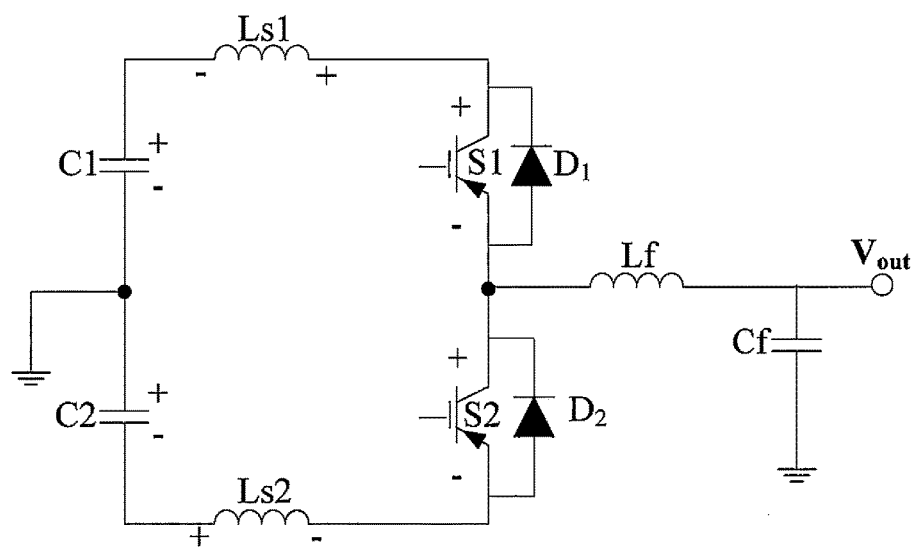
FIG. 3 is a block diagram showing a structure of a half-bridge circuit employing IGBTs in related arts.
Figure 4:
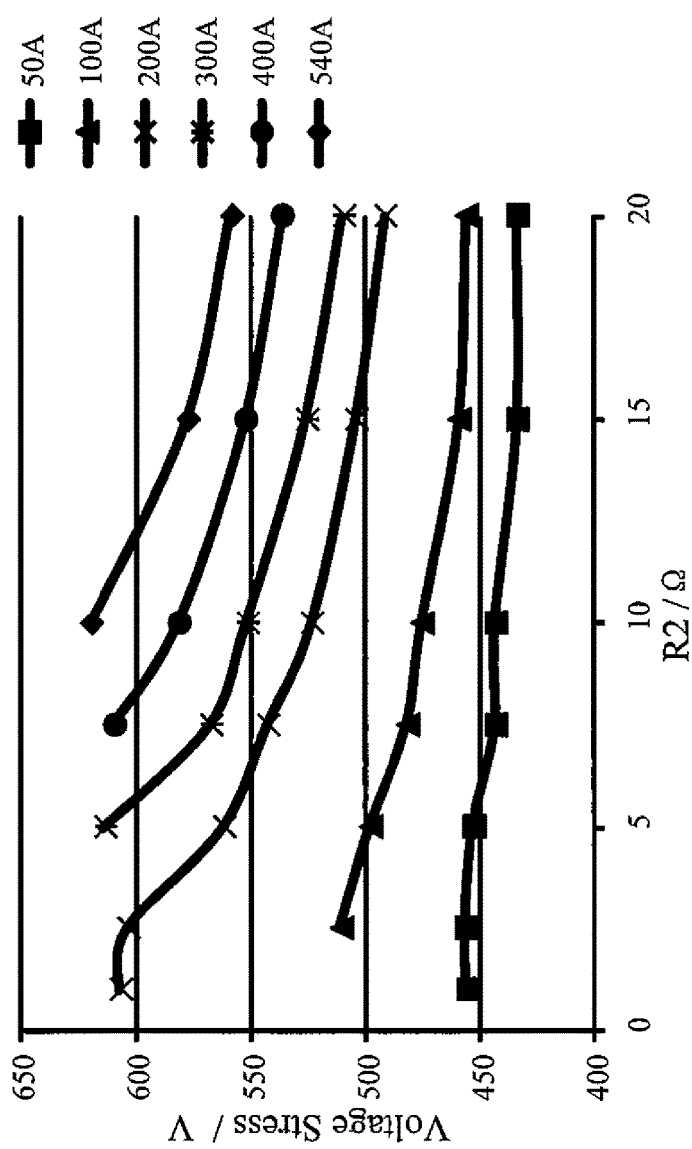
FIG. 4 is a graph showing relationships among the voltage stress and the driving resistance and a turn-off current of the IGBT in FIG. 3.
Figure 5:
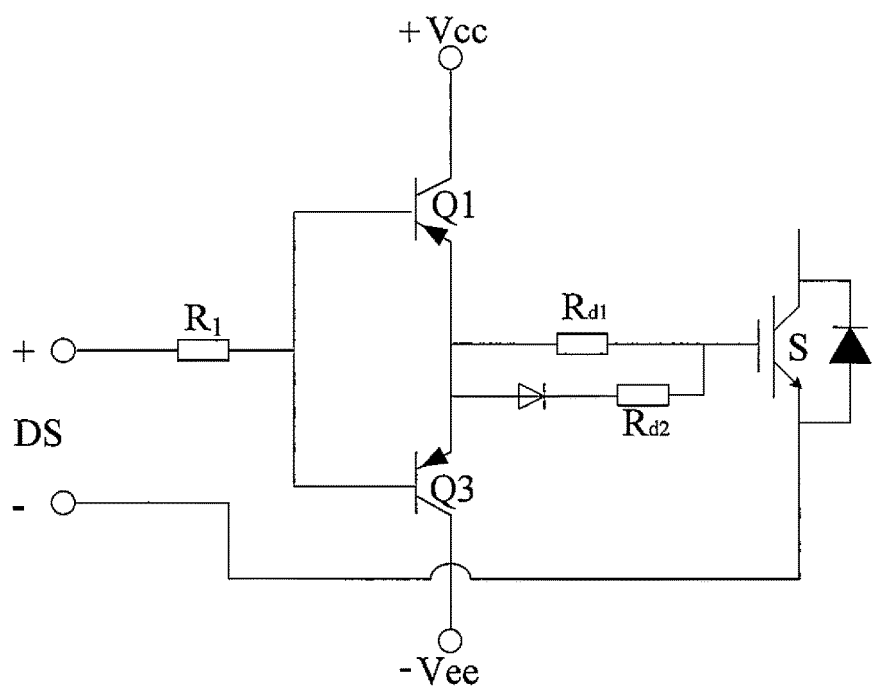
FIG. 5 is a block diagram showing a structure of another IGBT driving circuit in related arts.

Implementations will be described more comprehensively with reference to the drawings. However, the implementations may be carried out in various manners, and shall not be interpreted as being limited to the implementations set forth herein; instead, providing these implementations will make the present disclosure more comprehensive and complete and will fully convey the conception of the implementations to one of ordinary skill in this art. In the drawings, thicknesses of regions and layers are exaggerated for the sake of clarity. Throughout the drawings similar reference characters indicate the same or similar structures, and their detailed description will be omitted.

In addition, the features, structures or characteristics described herein may be combined in one or more embodiments in any suitable manner. In the following description, many specific details are provided to facilitate sufficient understanding of the embodiments of the present disclosure. However, one of ordinary skill in this art will appreciate that the technical solutions in the present disclosure may be practiced without one or more of the specific details, or other methods, elements, materials and so on may be employed. In other conditions, well-known structures, materials or operations are not shown or described in detail to avoid confusion of respective aspects of the present disclosure.

Figure 6:
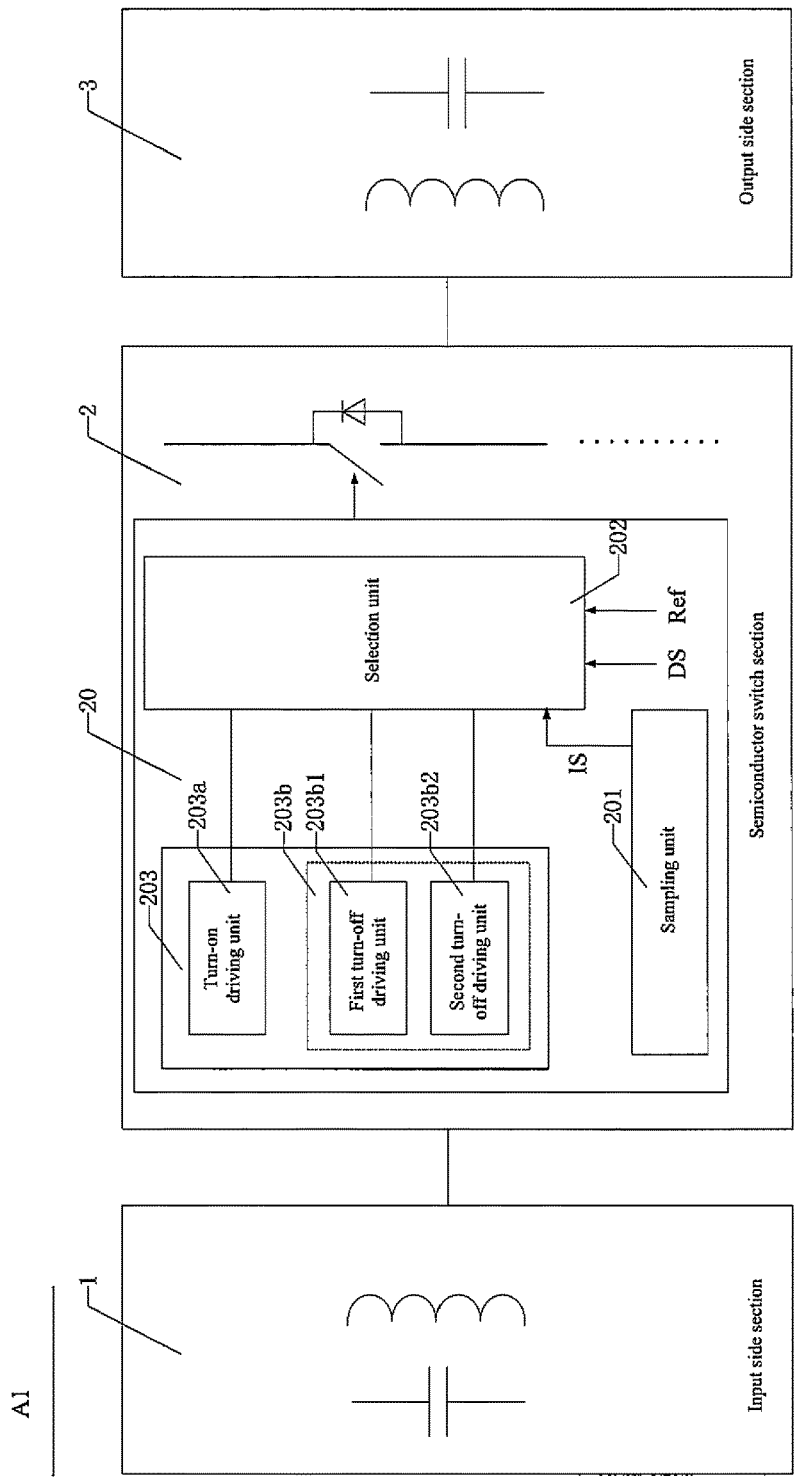
FIG. 6 is a block diagram showing a converter system in one embodiment of the present disclosure.

FIG. 6 is a block diagram showing a converter system in one embodiment of the present disclosure. The converter system A1 includes a main circuit module and a control circuit module. The main circuit module includes an input side section 1, an output side section 3 and a semiconductor switch section 2. In the embodiment, the main circuit module may be an inverter circuit, a rectifier circuit, a DC to DC circuit or an AC to AC circuit. The input side section 1 and the output side section 3 include passive components as capacitors and inductors. The semiconductor switch section 2 includes at least one semiconductor switch. The main circuit module receives an input signal, and converts the input signal into a required output signal by the on and off of the semiconductor switch. The control circuit module includes a driving circuit 20 for a semiconductor switch. The driving circuit 20 is configured to provide a driving signal to the semiconductor switch to turn on or off the semiconductor switch.

In the embodiment, the driving circuit 20 includes a sampling unit 201, a selection unit 202 and a driving unit 203. The driving unit 203 includes a turn-on driving unit 203a and a turn-off driving unit 203b. The turn-off driving unit 203b includes at least two turn-off driving units with different turn-off parameters. As shown in FIG. 6, the turn-off driving unit 203b may include a first turn-off driving unit 203b1 and a second turn-off driving unit 203b2 with different turn-off parameters.

The sampling unit 201 is configured to sample a sampling signal reflecting a working state of the semiconductor switch, for example, a sampling current IS. The sampling unit 201 outputs the sampling current IS to the selection unit

202. The sampling current IS may be a current signal of the semiconductor switch or a current signal on passive components such as capacitors and inductors in the circuit, and but the disclosure is not limited in this regard. The selection unit 202 receives a driving control signal DS, the sampling current IS and at least one reference value Ref. When the driving control signal DS is a first control signal, the selection unit 202 determines the working state of the semiconductor switch according to the sampling current IS and the reference value Ref, and then selects a turn-off driving unit with a turn-off parameter adaptive to the determined working state to turn off the semiconductor switch. For example, the first turn-off driving unit 203$b1$ and the second turn-off driving unit 203$b2$ have different turn-off speeds, and in the embodiment, the selection unit 202 may be configured to select a turn-off driving unit having a slower turn-off speed when the sampling current IS is larger, and vice versa. Moreover, when the driving control signal DS is a second control signal, the selection unit 202 selects the turn-on driving unit to turn on the semiconductor switch.

In the foregoing driving circuit, pluralities of turn-off driving units with different turn-off parameters are provided and a turn-off driving unit with a turn-off parameter adaptive to the working state of the semiconductor switch is selected to turn off the semiconductor switch. In this way, a relatively small switching loss may be obtained and the system efficiency may be improved on one hand; on the other hand, the security character of the system may be improved and the reliability of the system may be increased.

The foregoing turn-off parameters may be the turn-off resistance, turn-off voltages and turn-off currents, and the like of the turn-off driving units. Detailed description will be made as follows.

In an embodiment, illustration will be made taking an example where turn-off parameters in a driving circuit for a semiconductor switch are resistance of turn-off driving units. When a driving control signal DS is a first control signal, a selection unit selects a turn-off driving unit having turn-off resistance adaptive to the determined working state to turn off a semiconductor switch. For example, the turn-off driving units include a first turn-off driving unit and a second turn-off driving unit, and the turn-off resistance of the first turn-off driving unit is larger than the turn-off resistance of the second turn-off driving unit. The selection unit receives a reference value and a sampling current, and compares the reference value with the sampling current: if the sampling current is larger than the reference value, then the selection unit may select the first turn-off driving unit to turn off the semiconductor switch; and if the sampling current is smaller than or equal to reference value, then the selection unit may select the second turn-off driving unit to turn off the semiconductor switch. More detailed descriptions will be given hereinafter with reference to FIGS. 7 to 12.

Figure 7:
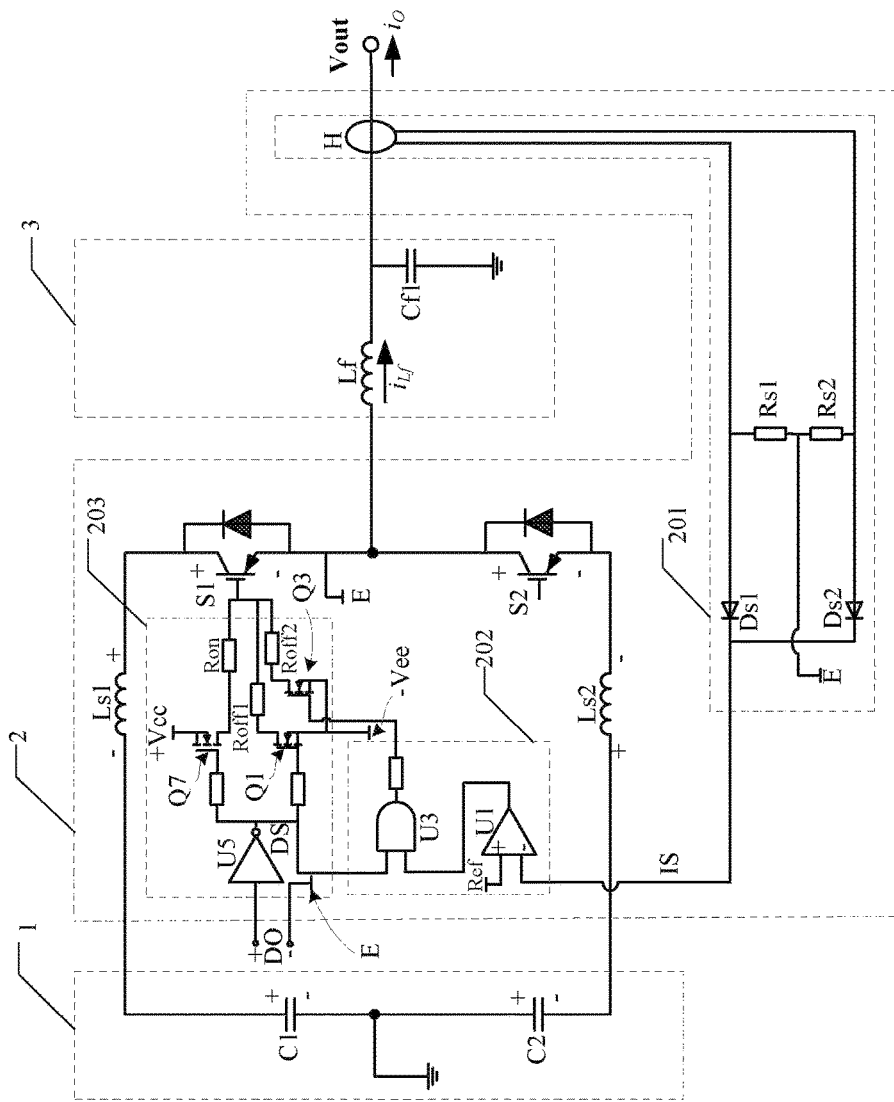
FIG. 7 is a block diagram showing a structure of a power system according to an embodiment of the present disclosure.

As shown in FIG. 7, the driving circuit for a semiconductor switch is applied to an inverter circuit. An input side section 1 of a main circuit module of the inverter circuit includes a first capacitor C1 and a second capacitor C2, and a first terminal of the first capacitor C1 is coupled with a first terminal of the second capacitor C2. A semiconductor switch section 2 of the main circuit module includes a half-bridge switching circuit composed of a first semiconductor switch S1 and a second semiconductor switch S2. An input terminal of the first semiconductor switch S1 is coupled with a second terminal of the first capacitor C1. A control terminal of the first semiconductor switch S1 receives a driving signal output by the driving circuit. An output terminal of the second semiconductor switch S2 is coupled with a second terminal of the second capacitor C2. A control terminal of the second semiconductor switch S2 receives another driving signal (not shown) output by the driving circuit. An output side section 3 of the main circuit module includes an output inductor Lf and a first output capacitor Cf1. A first terminal of the output inductor Lf is coupled with an output terminal of the first semiconductor switch S1 and an input terminal of the second semiconductor switch S2. A second terminal of the output inductor Lf is coupled with an output port. A first terminal of the first output capacitor Cf1 is coupled with a second terminal of the output inductor Lf, and a second terminal of the first output capacitor Cf1 is grounded. Ls1 and Ls2 in the figure are parasitic inductors in the circuit. The main circuit module of the inverter circuit converts DC voltages across the first capacitor C1 and the second capacitor C2 connected in series into an AC output voltage Vout.

The structure of the main circuit module is not limited to the half-bridge switching topology of the inverter circuit, it may be other circuits such as a DC conversion circuit or the like. For example, it may be a DC/DC buck converter circuit. Rather, the driving circuit provided in the embodiment may also be employed in other circuit topologies such as a full-bridge circuit topology, three-level circuit topology or the like. The first semiconductor switch S1 and the second semiconductor switch S2 include a MOSFET switch, an IGBT switch or a BJT switch, or one or more of switches formed by a plurality of MOSFET switches, IGBT switches or BJT switches connected in series or in parallel, wherein the MOSFET may either be a Si MOSFET or a MOSFET such as a SiC MOSFET or a GaN MOSFET made of a wide bandgap semiconductor material or other materials, and the present embodiment is not limited in this regard.

Further referring to FIG. 7, the control circuit module of the inverter circuit includes the driving circuit provided in the embodiment. The driving circuit mainly includes a sampling unit 201, a selection unit 202 and a driving unit 203. The driving unit 203 includes a first turn-off driving unit, a second turn-off driving unit and a turn-on driving unit.

The sampling unit 201 may include current sampling elements such as a current transformer, a Hall element, a Rogowski coil or the like. In addition, methods such as series sampling resistors may be employed, and alternatively, voltage drop across a sampling device may be directly employed.

For example, in the embodiment, the sampling unit 201 may include a Hall element H, a first sampling resistor Rs1, a first rectifier diode DS1, a second sampling resistor Rs2 and a second rectifier diode DS2. The Hall element H is configured to induce the current at a sampling node. A first terminal of the first sampling resistor Rs1 is coupled with a first terminal of the Hall element H, and a second terminal of the first sampling resistor Rs1 is grounded. An input terminal of the first rectifier diode DS1 is coupled with the first terminal of the first sampling resistor Rs1, and an output terminal of the first rectifier diode DS1 is coupled with the selection unit 202. A first terminal of the second sampling resistor Rs2 is coupled with a second terminal of the Hall element H, and a second terminal of the first sampling resistor Rs1 is grounded. An input terminal of the second rectifier diode DS2 is coupled with a first terminal of the second sampling resistor Rs2, and an output terminal of the second rectifier diode DS2 is coupled with the selection unit 202. In the embodiment, the sampling node is located at an output port of the main circuit module. In other embodiment of the present disclosure, the sampling node may also be located at other position of the main circuit module. The Hall element H in the sampling unit 201 samples an output current io as a sampling current signal. The sampling current signal flows to the first rectifier diode DS1 and the second rectifier diode DS2 through the first sampling resistor Rs1 and the second sampling resistor Rs2, and then is rectified by the first rectifier diode DS1 and the second rectifier diode DS2 to obtain a sampling current IS.

The selection unit 202 may include a first comparator U1 and a first AND gate U3. The first comparator U1 has input terminals receiving the sampling current IS and a reference value Ref, and outputs a comparison signal according to a comparison result of the sampling current IS and the reference value Ref. For example, if the absolute value of the sampling current IS is smaller than the reference value Ref, then the first comparator U1 outputs a comparison signal of high level. If the absolute value of the sampling current IS is larger than the reference value Ref, then the first comparator U1 outputs a comparison signal of low level. An input terminal of the first AND gate U3 receives the comparison signal and the other input terminal of the first AND gate U3 receives a driving control signal DS. The first AND gate U3 performs "AND" operation on the received signals and then outputs a signal v3 to a control terminal of a second switching device Q3. In the embodiment, the driving circuit may also include a first NOT gate U5. An input terminal of the first NOT gate U5 receives an original control signal DO. The first NOT gate U5 performs "NOT" operation on the original control signal DO and then outputs the foregoing driving control signal DS.

The first turn-off driving units may include a first switching device Q1 and a first turn-off resistor Roff1. An input terminal of the first switching device Q1 is coupled with a low potential −Vee, and a control terminal of the first switching device Q1 receives the driving control signal DS to turn on the first switching device Q1 when the driving control signal DS is a first control signal. A first terminal of the first turn-off resistor Roff1 is coupled with an output terminal of the first switching device Q1, and a second terminal of the first turn-off resistor Roff1 is coupled with a control terminal of the first semiconductor switch S1. In the embodiment, the switching devices in the driving circuit may include one or more of a MOSFET switch, an IGBT switch, a BJT switch and the like. The MOSFET switch may include a Si MOSFET switch, a SiC MOSFET switch, a GaN MOSFET switch or the like.

The second turn-off driving unit may include the first switching device Q1, the first turn-off resistor Roff1, a second switching device Q3 and a second turn-off resistor Roff2. An input terminal of the second switching device Q3 is coupled with the low potential −Vee, and a control terminal of the second switching device Q3 receives a signal output by the selection unit 202 to turn on or off the second switching device Q3 according to the output signal. A first terminal of the second turn-off resistor Roff2 is coupled with an output terminal of the second switching device Q3, and a second terminal of the second turn-off resistor Roff2 is coupled with a control terminal of the first semiconductor switch S1. In the embodiment, the second turn-off driving unit shares a part of components of the first turn-off driving unit. In other embodiments, the first turn-off driving unit and the second turn-off driving unit may be respectively independent circuits.

The first switching device Q1 is switched on when the driving control signal DS is a first control signal (for example, a high level signal). And when the absolute value of the sampling current IS is larger than the reference value Ref, then the comparison signal output by the first comparator U1 is a low level signal, and the first AND gate U3 outputs a low level signal, and thus the second switching device Q3 is turned off. At this moment, the first turn-off driving unit works and the turn-off resistance is Roff1. While when the absolute value of the sampling current IS is smaller than or equal to the reference value Ref, then the comparison signal output by the first comparator U1 is a high level signal, and the first AND gate U3 outputs a high level signal to drive the second switching device Q3 to be on. At this moment, the second turn-off driving unit works and the equivalent resistance is the resistance obtained by parallel of the first turn-off resistor Roff1 and the second turn-off resistor Roff2. In the above control, the voltage at the control terminal of the semiconductor switch S1 is pulled down no matter the first turn-off driving unit or the second turn-off driving unit works; therefore, the semiconductor switch S1 is turned off.

The turn-on driving unit may include a fourth switching device Q7 and an on resistor Ron. An input terminal of the fourth switching device Q7 is coupled with a high potential +Vcc, and a control terminal of the fourth switching device Q7 receives a driving control signal DS. A first terminal of the on resistor Ron is coupled with an output terminal of the fourth switching device Q7, and a second terminal of the on resistor Ron is coupled with the control terminal of the first semiconductor switch S1. When the driving control signal DS is a second control signal (a lower level signal, for example), the fourth switching device Q7 is switched on, the turn-on driving unit works, and the on resistance is Ron. At this moment, the voltage at the control terminal of the semiconductor switch S1 is elevated; therefore, the semiconductor switch S1 is switched on.

Figure 8:
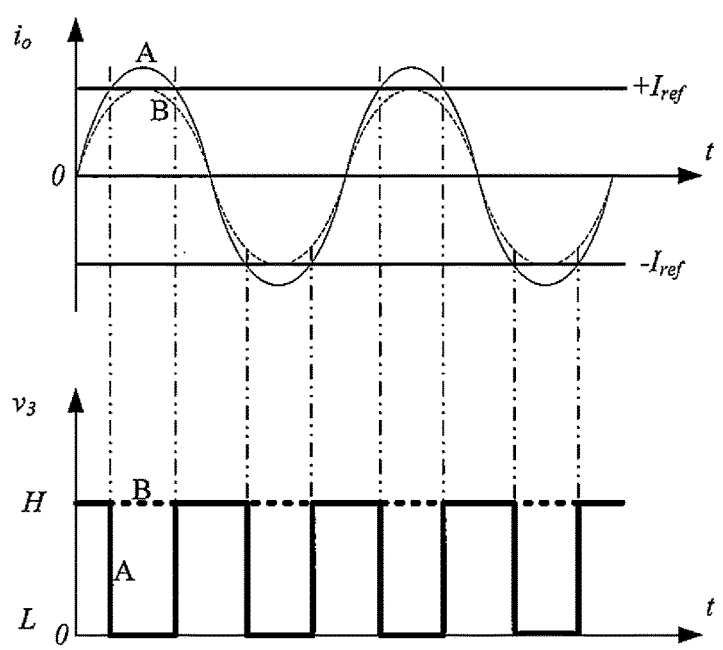
FIG. 8 is a schematic diagram showing a relationship between an output current and a signal output by an AND gate in FIG. 7.

Referring to FIG. 8, taking the turn-off operation of the semiconductor switch S1 as an example, in the working condition A as shown in the figure, when the sampling current IS is smaller than the reference value Ref, the signal output by the first AND gate U3 is a high level signal, and the turn-off resistance of the first semiconductor switch S1 has a smaller value, i.e., Roff1/Roff2. Thus, better switching loss characteristics may be obtained. When the sampling current IS is larger than the reference value Ref, the signal output by the first AND gate U3 is a low level signal, and the turn-off resistance of the first semiconductor switch S1 has a larger value, i.e., Roff1. Thus, it is ensured that the voltage stress of the first semiconductor switch S1 satisfies requirements. In the working condition B as shown in the figure, the sampling current IS is smaller than the reference value Ref all the time, the signal output by the first AND gate U3 is a high level signal all the time, and the turn-off resistance of the first semiconductor switch S1 has a smaller value (i.e., Roff1/Roff2) all the time. Thus, it can be seen that, the driving circuit in the embodiment may improve the efficiency of the converter system under the premise of satisfying the voltage stress of the semiconductor switch. Moreover, it can be seen that the change of the turn-off resistance of the semiconductor switch in the driving circuit is a fundamental-wave-based change (line cycle), and this is more reliable than the quick switching of the turn-off resistance in a switching period.

Figure 9:
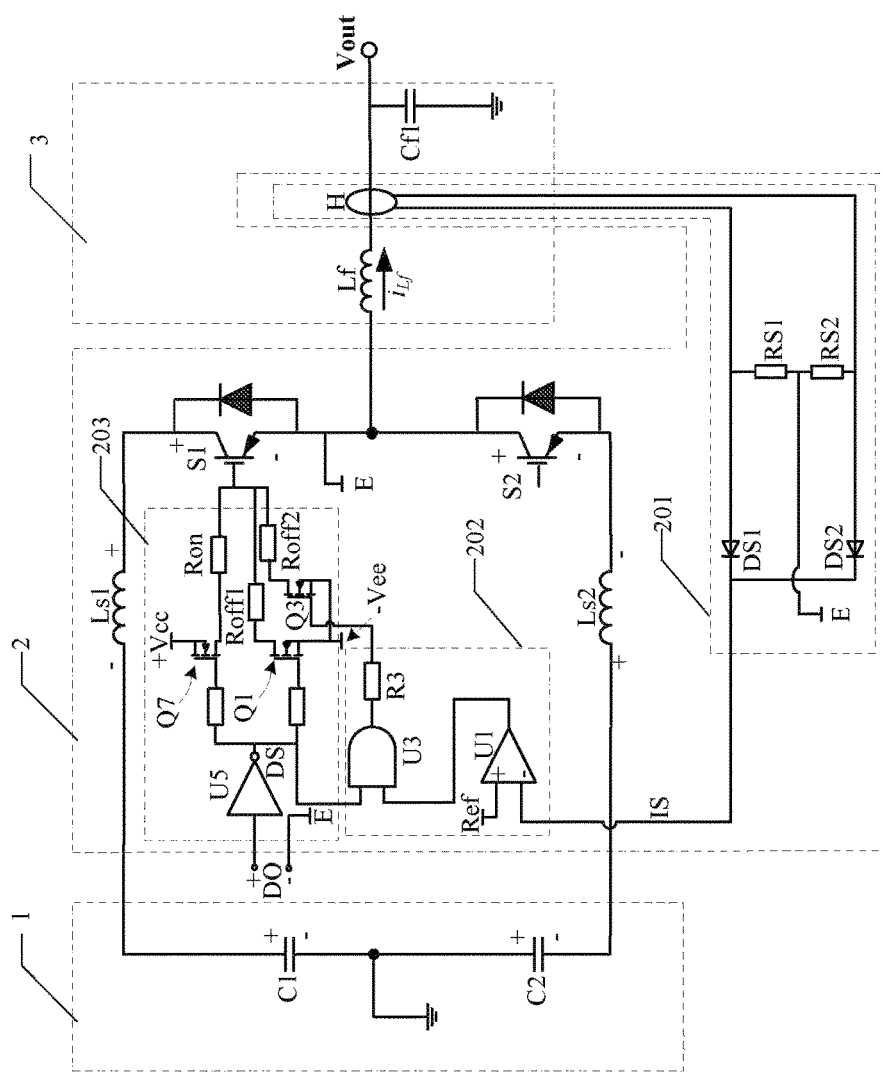
FIG. 9 is a block diagram showing a structure of another converter system according to an embodiment of the present disclosure.

FIG. 9 is a block diagram showing another embodiment of an inverter circuit in an embodiment. In the embodiment, the sampling node of the sampling unit 201 is located between a second terminal of an output inductor Lf and a first terminal of the first output capacitor Cf1, and the sampling current IS is the current $i_{Lf}$ of the output inductor Lf. Other sections of the circuit are identical to the inverter circuit in FIG. 7, which will not be elaborated herein. Moreover, in other embodiments of the present disclosure, the sampling current IS may also be a current flowing through the semiconductor switch and the like, which will not be specially defined in the embodiment.

Figure 10:
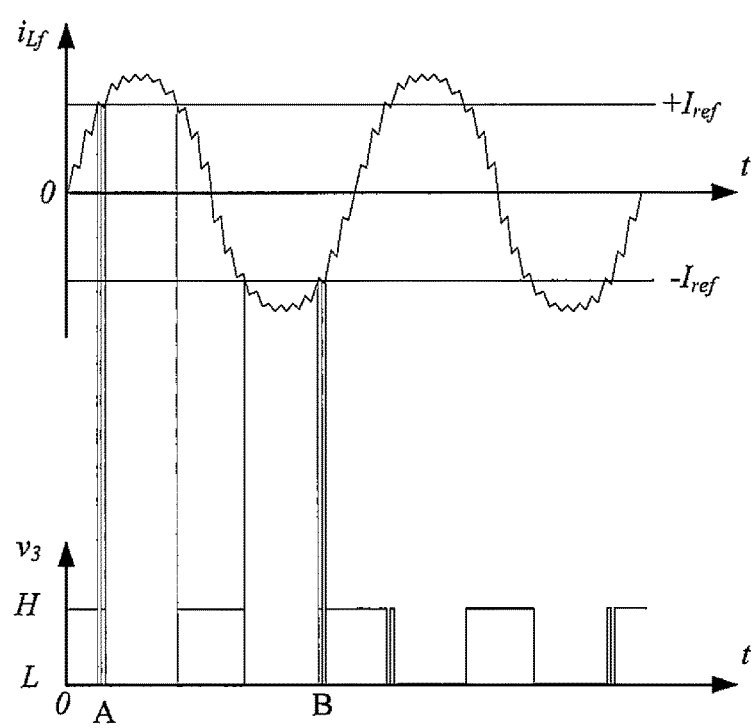
FIG. 10 is a schematic diagram showing a relationship between a current of an output inductor and a signal output by an AND gate in FIG. 9.

FIG. 10 shows a relationship between the current of the output inductor Lf and the signal output by the first AND gate U3 in FIG. 9. When the current $i_{Lf}$ of the output inductor Lf is smaller than the reference value Ref, the signal v3 output by the first AND gate U3 is a high level signal, and the turn-off resistance of the first semiconductor switch S1 has a smaller value, i.e., Roff1/Roff2. Thus, better switching loss characteristics may be obtained. When the sampling current $i_{Lf}$ of the output inductor Lf is larger than the reference value Ref, the signal v3 output by the first AND gate U3 is a low level signal, and the turn-off resistance of the first semiconductor switch S1 has a larger value, i.e., Roff1. Thus, it is ensured that the voltage stress of the first semiconductor switch S1 satisfies requirements. It may be seen from FIG. 10 that since the current $i_{Lf}$ of the output inductor Lf has high frequency ripples, switching between high level and low level of the signal v3 output by the first AND gate U3 within one switching period appear at A and B. Although the signal v3 output by the first AND gate U3 appears to be a high level signal for a short period at A, there is no actual turn-off action in this period. Therefore, appearance of Roff1/Roff2 in this short period does not occur actually. Similarly, appearance of the Roff1 at B in a short period does not occur actually. Therefore, the turn-off resistance is actually switched based on fundamental wave frequency.

In order to avoid switching of the signal output by the first AND gate U3 within the switching period due to the influence of high frequency ripples, a hysteresis method may be employed for determination. Moreover, the current through the output inductor Lf may also be filtered to filter the high frequency ripples, and determination is performed after a waveform similar to the sampling current IS in FIG. 8 is obtained, so as to select proper turn-off resistance.

Figure 11:
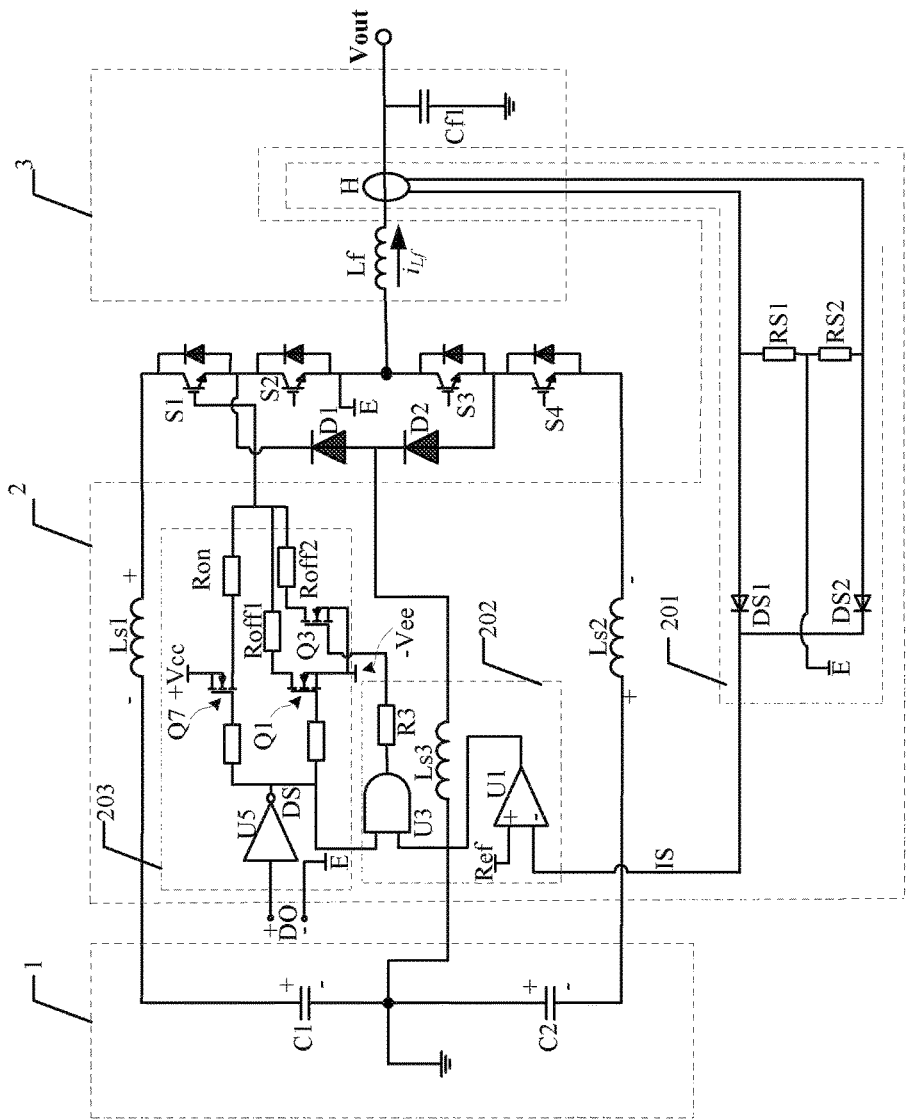
FIG. 11 is a block diagram showing still another converter system according to an embodiment of the present disclosure.

FIG. 11 is a block diagram showing another implementation of an inverter circuit in an embodiment. In the implementation, a main circuit module of the inverter circuit is a three-level topological structure, and more particularly, is a neutral point clamped (NPC) three-level topology. The main circuit module of the inverter circuit includes a first bridge arm and a second bridge arm. The first bridge arm composed of a first capacitor C1 and a second capacitor C2 connected in series forms an input side section 1 of the main circuit module of the inverter circuit. The second bridge arm consists of a first semiconductor switch S1, a second semiconductor switch S2, a third semiconductor switch S3 and a fourth semiconductor switch S4 connected in series orderly. The main circuit module of the inverter circuit further includes a first diode D1 and a second diode D2. A cathode of the first diode D1 is coupled with a junction of the first semiconductor switch S1 and the second semiconductor switch S2. An anode of the first diode D1 is coupled with a junction of the first capacitor C1 and the second capacitor C2. An anode of the second diode D2 is coupled with a junction of the third semiconductor switch S3 and the fourth semiconductor switch S4. A cathode of the second diode D2 is coupled with an anode of the first diode D1 and the junction of the first capacitor C1 and the second capacitor C2. The first semiconductor switch S1, the second semiconductor switch S2, the third semiconductor switch S3, the fourth semiconductor switch S4, the first diode D1 and the second diode D2 constitute a semiconductor switch section 2 of the main circuit module. The main circuit module of the inverter circuit further includes an output inductor Lf and a first output capacitor Cf1 to form an output side section 3. A first terminal of the output inductor Lf is coupled with the junction of the second semiconductor switch S2 and the semiconductor switch S3. A first terminal of the first output capacitor Cf1 is coupled with a second terminal of the output inductor Lf and an output port, and a second terminal of the first output capacitor Cf1 is grounded. Ls1, Ls2 and Ls3 as shown in the figure are parasitic inductors in the circuit.

Compared with the half-bridge switching circuits in FIG. 7 and in FIG. 9, the three-level circuit in FIG. 11 may employ semiconductor switches having a lower rated voltage, thus obtaining better loss characteristics. Other sections of the circuit are identical to that of the inverter circuit in FIG. 9, which will not be elaborated herein. Moreover, in other embodiments of the present disclosure, the three-level topological structure may also be an active neutral point clamped (ANPC) three-level topology or T-type neutral point clamped (TNPC) three-level topology, and the like, which will not be specially defined in the embodiment.

Figure 12:
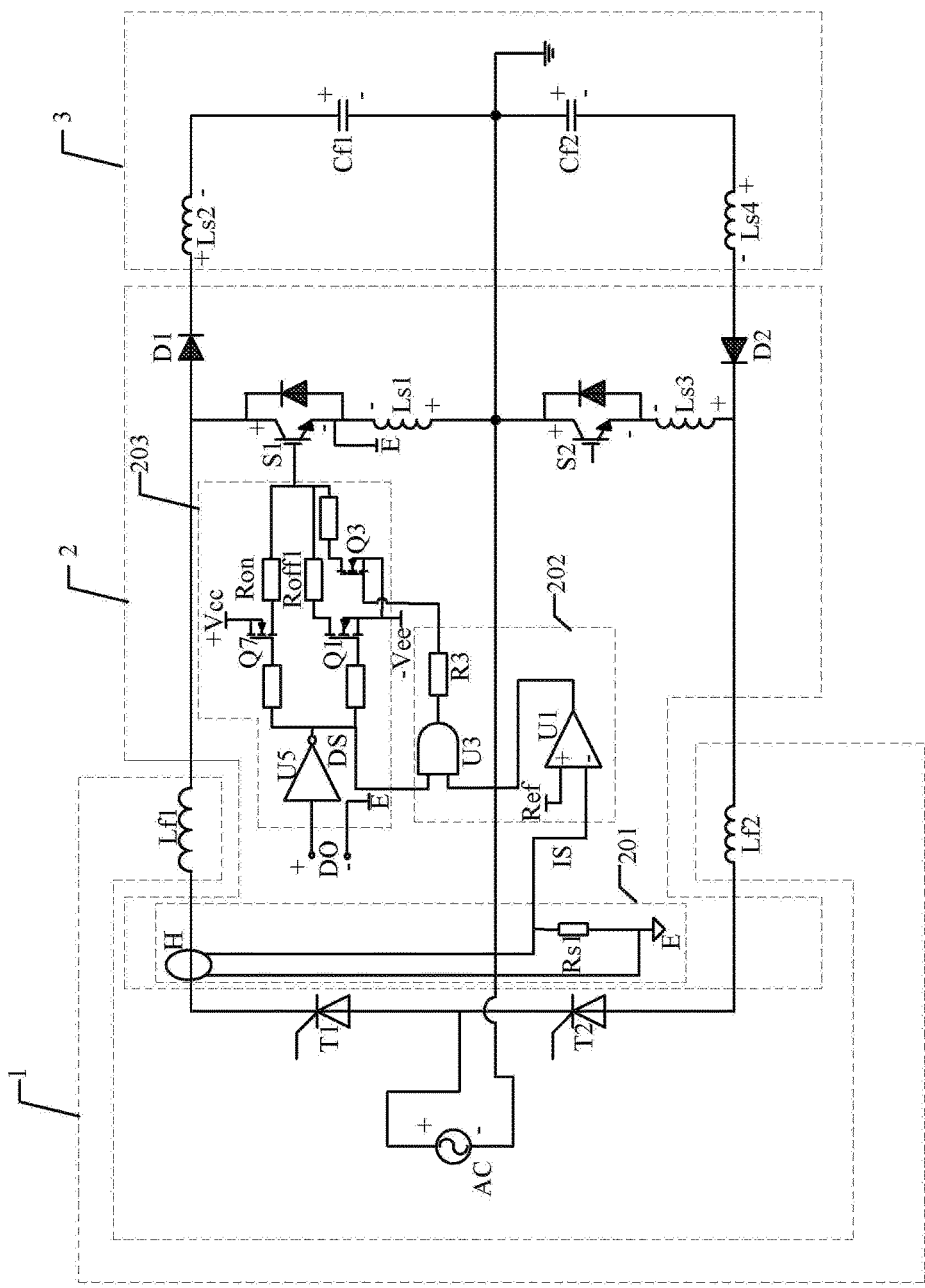
FIG. 12 is a block diagram showing a structure of yet another converter system according to an embodiment of the present disclosure.

Referring to FIG. 12, the driving circuit is applied in a rectifier circuit. A main circuit module of the rectifier circuit includes a first bridge arm, a second bridge arm, a first inductor Lf1, a second inductor Lf2, an AC power supply AC, a first diode D1, a second diode D2, a first output capacitor Cf1 and a second output capacitor Cf2. The first bridge arm consists of a first thyristor T1 and a second thyristor T2 connected in series, and the second bridge arm consists of a first semiconductor switch S1 and a second semiconductor switch S2 connected in series. The first inductor Lf1 is connected in series between the first thyristor T1 and the first semiconductor switch S1, and the second inductor Lf2 is connected in series between the second thyristor T2 and the second semiconductor switch S2. A first terminal of the AC power supply AC is coupled with a junction of the first thyristor T1 and the second thyristor T2, and a second terminal of the AC power supply AC is coupled with a junction of the first semiconductor switch S1 and the second semiconductor switch S2. An anode of the first diode D1 is coupled with a junction of the first inductor Lf1 and the first semiconductor switch S1, and a cathode of the second diode D2 is coupled with a junction of the second inductor Lf2 and the second semiconductor switch S2. A first terminal of the first output capacitor Cf1 is coupled with the cathode of the first diode DE A first terminal of the second output capacitor Cf2 is coupled with the anode of the first diode D1, and a second terminal of the second output capacitor Cf2 is coupled with the second terminal of the first output capacitor Cf1 and the junction of the first semiconductor switch S1 and the second semiconductor switch S2. Ls1, Ls2, Ls3 and Ls4 as shown in the figure are parasitic inductors in the circuit. The first inductor Lf1 and the second inductor Lf2 above mentioned constitute an input side section 1 of the main circuit module, and the first output capacitor Cf1 and the second output capacitor Cf2 constitute an output side section 3 of the main circuit module. The first semiconductor switch S1, the first diode D1, the second semiconductor switch S2 and the second diode D2 constitute a semiconductor switch section 2 of the main circuit module. The positive half cycle of the voltage of the AC power supply AC is rectified by the first thyristor T1 and is transferred to the first inductor Lf1, and the negative half cycle of the voltage of the AC power supply AC is rectified by the second thyristor T2 and is transferred to the second inductor Lf2. The first inductor Lf1, the first semiconductor switch S1 and the first diode D1 constitute a boost power factor correction (boost PFC) circuit to realize power factor correction function on the positive half cycle of the voltage of the AC power supply AC. The second inductor Lf2, the second semiconductor switch S2 and the second diode D2 constitute a power factor correction circuit to realize power factor correction function on the negative half cycle of the voltage of the AC power supply AC. The first capacitor C1 and the second capacitor C2 are filtering capacitors which are configured to reduce voltage ripples at the DC side.

Further referring to FIG. 12, the control circuit module of the inverter circuit includes the driving circuit provided in the embodiment. The driving circuit mainly includes a sampling unit 201, a selection unit 202 and a driving unit 203. The driving unit 203 includes a first turn-off driving unit, a second turn-off driving unit and a turn-on driving unit.

The sampling unit 201 may include current sampling elements such as a current transformer, a Hall element, a Rogowski coil or the like. In addition, such method as series sampling resistors may be employed, and alternatively a voltage drop across a sampling device may be directly employed.

For example, the sampling unit 201 may include a Hall element H and a first sampling resistor Rs1 in the embodiment. The Hall element H is configured to induce the current at a sampling node. A first terminal of the Hall element H is grounded and a second terminal thereof is coupled with the selection unit 202. The first sampling resistor Rs1 is connected in parallel between the first terminal and the second terminal of the Hall element H. In the embodiment, the sampling node of the sampling unit 201 is located between the first thyristor T1 and the first inductor Lf1 or between the second thyristor T2 and the second inductor Lf2. In other embodiments of the present disclosure, the sampling node may also be located at other positions of the main circuit module. The Hall element H in the sampling unit 201 samples the current through the first inductor Lf1 as a sampling current IS. Since the current through the first inductor Lf1 is a DC signal, rectifying is not needed. The sampling current IS is input to an input terminal of a first comparator U1 in the selection unit 202 and is compared with a reference value Ref by the first comparator U1. The structures and working principles of the selection unit 202 and the driving unit are similar to that in FIG. 9, which will not be repeatedly elaborated herein.

It should be noted that the rectifier circuit in the embodiment may also be changed into other circuit topologies. The first semiconductor switch S1 and the second semiconductor switch S2 may include a MOSFET switch, an IGBT switch or a BJT switch, or one or more of switches formed by a plurality of MOSFET switches, IGBT switches or BJT switches connected in series or in parallel. The MOSFET may either be a Si MOSFET or a MOSFET such as a SiC MOSFET or a GaN MOSFET made of wide bandgap semiconductor material or other materials. The present disclosure does not impose specific limitations on this.

In an embodiment, illustration will be made taking an example where turn-off parameters in a driving circuit for a semiconductor switch are turn-off current of turn-off driving units. When a driving control signal is a first control signal, a selection unit selects a turn-off driving unit having a turn-off current adaptive to the determined working state to turn off a semiconductor switch. For example, the turn-off driving units include a first turn-off driving unit and a second turn-off driving unit, and the turn-off current of the first turn-off driving unit is smaller than the turn-off current of the second turn-off driving unit. The selection unit receives a reference value and a sampling current, and compares the reference value with the sampling current: if the sampling current is larger than the reference value, then the selection unit may select the first turn-off driving unit to turn off the semiconductor switch; and if the sampling current is smaller than or equal to the reference value, then the selection unit may select the second turn-off driving unit to turn off the semiconductor switch. More detailed descriptions will be given hereinafter with reference to FIG. 13.

Figure 13:
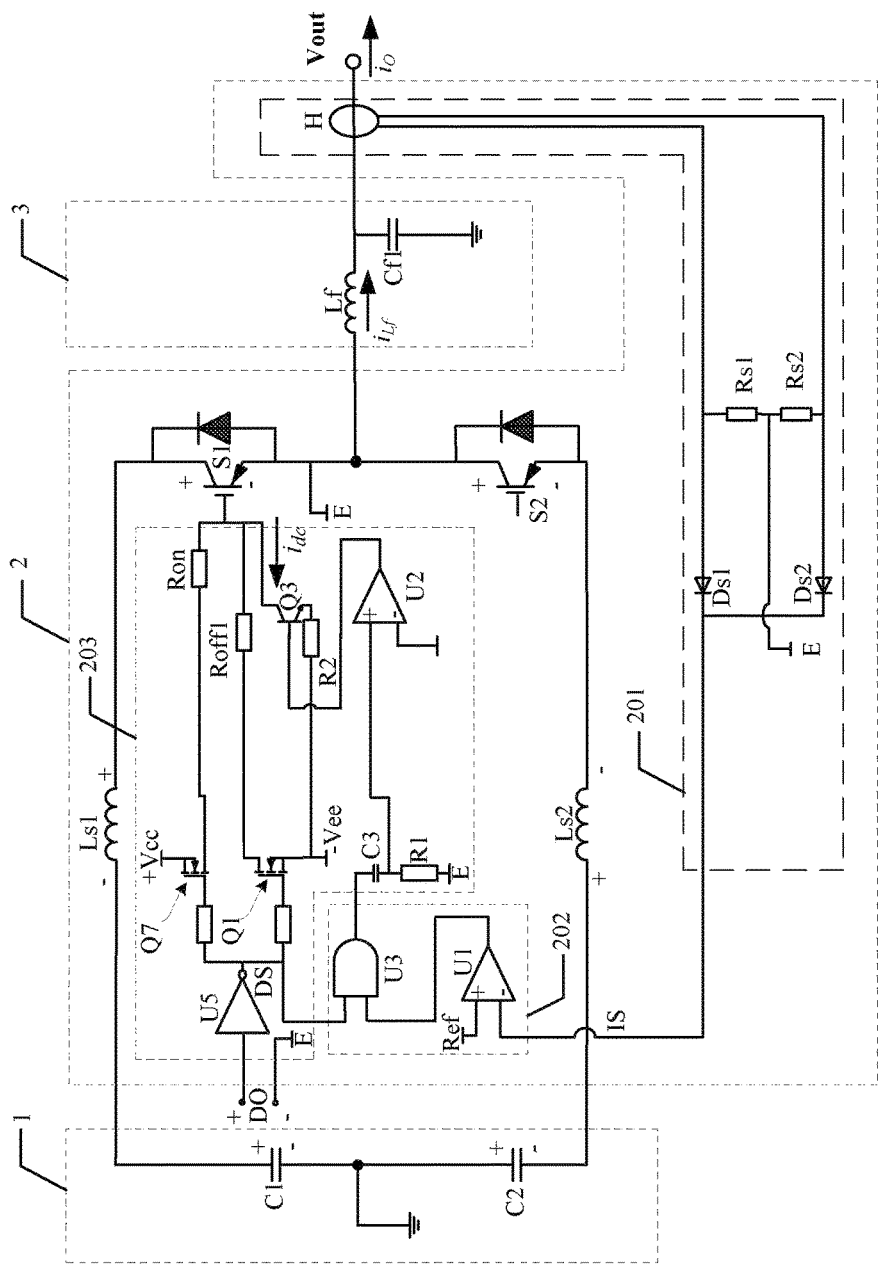
FIG. 13 is a block diagram showing a structure of a converter system according to an embodiment of the present disclosure.

As shown in FIG. 13, the driving circuit is applied in an inverter circuit. The structure of a main circuit module of the inverter circuit is similar to that of the main circuit module of the inverter circuit in the above embodiments. A control circuit module of the inverter circuit includes the driving circuit provided in the embodiment. The driving circuit mainly includes a sampling unit 201, a selection unit 202 and a driving unit 203. The driving unit 203 includes a first turn-off driving unit, a second turn-off driving unit and a turn-on driving unit.

The sampling unit 201 may include current sampling elements such as a current transformer, a Hall element, a Rogowski coil or the like. In addition, such method as series sampling resistors may be employed, and alternatively, a voltage drop across a sampling device may be directly employed. A sampling current IS sampled by the sampling unit 201 is input to an input terminal of a first comparator U1 in the selection unit 202 which will be described below and is compared with a reference value Ref by the first comparator U1. In the embodiment, the implementation of the sampling unit 201 is similar to that in the above embodiments, which will not be repeatedly elaborated herein.

The selection unit 202 may include the first comparator U1 and a first AND gate U3. The first comparator U1 has input terminals receiving the sampling current IS and the reference value Ref, and outputs a first comparison signal according to a comparison result of the sampling current IS and the reference value Ref. For example, if the absolute value of the sampling current IS is smaller than the reference value Ref, then the first comparator U1 outputs a first comparison signal of high level. If the absolute value of the sampling current IS is larger than the reference value Ref, then the first comparator U1 outputs a first comparison signal of low level. An input terminal of the first AND gate U3 receives the first comparison signal and the other input terminal thereof receives a driving control signal DS. The first AND gate U3 performs "AND" operation on the received signals and then outputs a signal to a control terminal of a second switching device Q3. In the embodiment, the driving circuit may also include a first NOT gate U5. An input terminal of the first NOT gate U5 receives an original control signal DO. The first NOT gate U5 performs "NOT" operation on the original control signal DO and then outputs the foregoing driving control signal DS.

The first turn-off driving unit may include a first switching device Q1 and a first turn-off resistor Roff1. An input terminal of the first switching device Q1 is coupled with a low potential −Vee, and a control terminal of the first switching device Q1 receives the driving control signal DS. A first terminal of the first turn-off resistor Roff1 is coupled with an output terminal of the first switching device Q1, and a second terminal of the first turn-off resistor Roff1 is coupled with a control terminal of the first semiconductor switch S1. In the embodiment, the switching devices in the driving circuit may include one or more of a MOSFET switch, an IGBT switch, a BJT switch, and the like, and the MOSFET switch may include a Si MOSFET switch, a SiC MOSFET switch, a GaN Mosfet switch or the like.

The second turn-off driving unit may include the first switching device Q1, the first turn-off resistor Roff1, a coupling capacitor C3, a first resistor R1, a second comparator U2, a second resistor R2 and a second switching device Q3. A first terminal of the coupling capacitor C3 receives a signal output by the selection unit 202. A first terminal of the first resistor R1 is coupled with a second terminal of the coupling capacitor C3, and a second terminal of the first resistor R1 is coupled with a reference ground. The second comparator U2 has input terminals coupled with the first terminal of the first resistor R1 and the reference ground, and outputs a second comparison signal according to the comparison result of the potential at the first terminal of the first resistor R1 and the potential at the reference ground. A first terminal of the second resistor R2 is coupled with the low potential −Vee. An input terminal of the second switching device Q3 is coupled with a second terminal of the second resistor R2, an output terminal of the second switching device Q3 is coupled with a control terminal of the first semiconductor switch S1, and the second switching device Q3 has a control terminal receiving a second comparison signal to turn on or off the second switching device Q3 according to the signal. It shall be readily appreciated that although the second turn-off driving unit in the embodiment shares a part of components of the first turn-off driving unit, the first turn-off driving unit and the second turn-off driving unit may also be respectively independent circuits in other embodiments.

During usage, the first switching device Q1 is switched on when the driving control signal DS is the first control signal (a high level signal, for example). And, when the absolute value of the sampling current IS is larger than the reference value Ref, then the comparison signal output by the first comparator U1 is a low level signal, and the first AND gate U3 outputs a low level signal, and thus the second switching device Q3 is turned off. At this moment, the first turn-off driving unit works and turns off the first semiconductor switch S1. when the absolute value of the sampling current IS is smaller than or equal to the reference value Ref, then the first AND gate U3 outputs a high level signal, and the voltage across the first resistor R1 rises sharply; therefore, the second comparator U2 outputs a high level signal to drive the second switching device Q3 to be on and thus a current source idc is obtained, wherein idc=(Vcc−Vee−0.7V)/R2 (0.7V is the threshold voltage of the second switching device Q3). The turn-off current at this moment is equal to the turn-off current of the first turn-off driving unit plus idc. That is, the turn-off current is increased, and the turn-off speed of the first semiconductor switch S1 is increased, and the turn-off loss of the first semiconductor switch S1 is reduced as well. During the foregoing process, after a certain period, even if the output terminal of the first AND gate U3 is still a high level signal, the voltage across the first resistor R1 will drop to zero, and the high level output by the first AND gate U3 is borne by the coupling capacitor C3. Therefore, the second comparator U2 outputs a low level signal to drive the second switching device Q3 to be off, and the current source idc is cut away from the turn-off driving unit.

The turn-on driving unit may include a fourth switching device Q7 and a turn-on resistor Ron. An input terminal of the fourth switching device Q7 is coupled with a high potential +Vcc, and a control terminal of the fourth switching device Q7 receives a driving control signal DS. A first terminal of the turn-on resistor Ron is coupled with an output terminal of the fourth switching device Q7, and a second terminal of the turn-on resistor Ron is coupled with a control terminal of the first semiconductor switch S1. During usage, when the driving control signal DS is a second control signal (a low level signal, for example), the fourth switching device Q7 is switched on, the voltage at the control terminal of the semiconductor switch S1 is elevated; therefore, the first semiconductor switch S1 is switched on.

It should be noted that the driving circuit in the embodiment is used in the inverter circuit; however, it may also be applied in other circuits such as a DC conversion circuit or the like. The present disclosure does not impose specific limitations on this.

In an embodiment, illustration will be made by taking an example where turn-off parameters in a driving circuit are turn-off voltages of turn-off driving units. In this case, a selection unit selects a turn-off driving unit having a turn-off voltage adaptive to the determined working state to turn off a semiconductor switch. For example, the turn-off driving units include a first turn-off driving unit and a second turn-off driving unit, and the turn-off voltage of the first turn-off driving unit is lower than the turn-off voltage of the second turn-off driving unit. The selection unit receives a reference value and a sampling current, and compares the reference value with the sampling current: if the sampling current is larger than the reference value, then the selection unit may select the first turn-off driving unit to turn off the semiconductor switch; and if the sampling current is smaller than or equal to the reference value, then the selection unit may select the second turn-off driving unit to turn off the semiconductor switch. More detailed descriptions will be given hereinafter with reference to FIG. 14.

Figure 14:
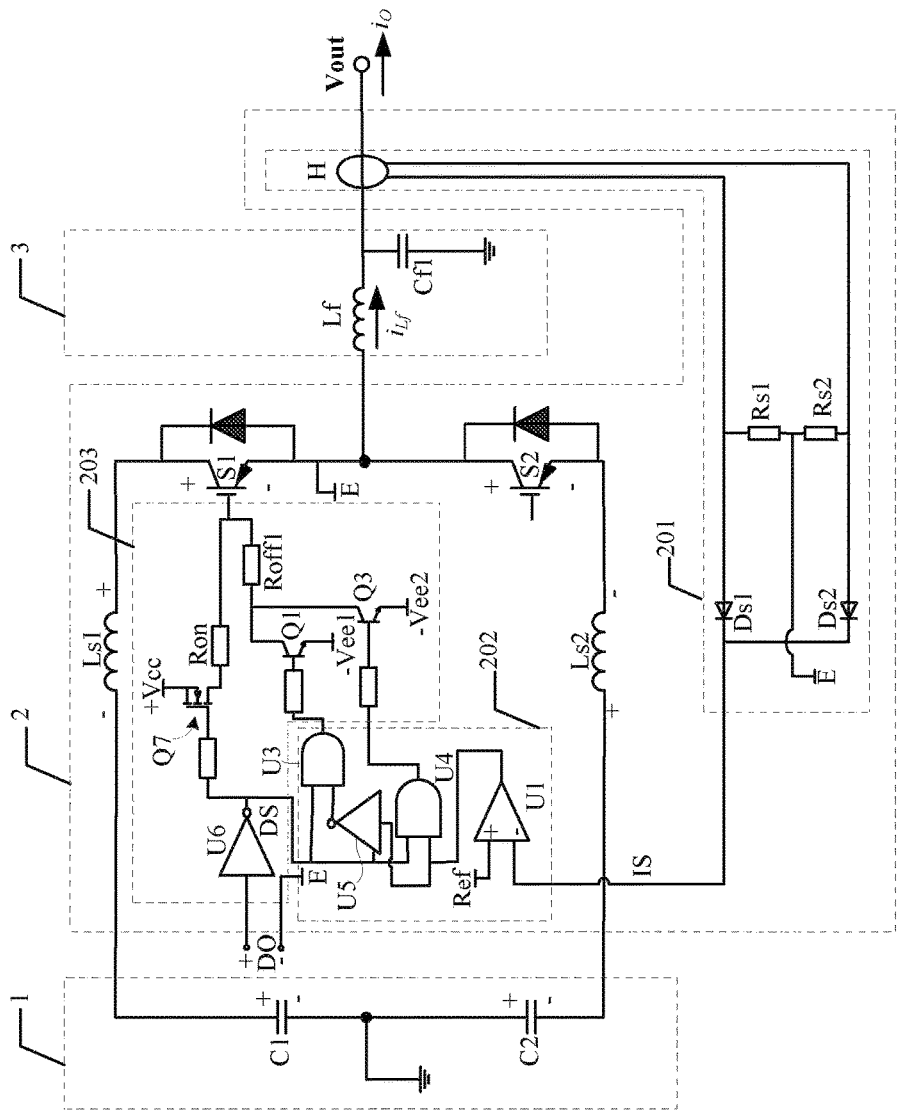
FIG. 14 is a block diagram showing a structure of a converter system according to an embodiment of the present disclosure.

As shown in FIG. 14, the driving circuit for a semiconductor switch is applied in an inverter circuit. The structure of a main circuit module of the inverter circuit is similar to that of the main circuit module of the inverter circuit in the above embodiments. A control circuit module of the inverter circuit includes the driving circuit provided in the embodiment. The driving circuit mainly includes a sampling unit 201, a selection unit 202 and a driving unit 203. The driving unit 203 includes a first turn-off driving unit, a second turn-off driving unit and a turn-on driving unit.

The sampling unit 201 may include current sampling elements such as a current transformer, a Hall element, a Rogowski coil or the like. In addition, such method as series sampling resistors may be employed, and alternatively, even a voltage drop across a sampling device may be directly employed. A sampling current IS sampled by the sampling unit 201 is input to an input terminal of a first comparator U1 in the selection unit 202 which will be described below and is compared with a reference value Ref by the first comparator U1. In the embodiment, the implementation of the sampling unit 201 is similar to that in the above embodiments, which will not be repeatedly elaborated herein.

The selection unit 202 may include a first comparator U1, a first NOT gate U5, a first AND gate U3 and a second AND gate U4. The first comparator U1 has input terminals receiving the sampling current IS and the reference value Ref, and outputs a comparison signal according to a comparison result of the sampling current IS and the reference value Ref. For example, if the absolute value of the sampling current IS is smaller than the reference value Ref, then the first comparator U1 outputs a comparison signal of high level. If the absolute value of the sampling current IS is larger than the reference value Ref, then the first comparator U1 outputs a comparison signal of low level. The first NOT gate U5 has an input terminal receiving the comparison signal, performs "AND" operation on the received signal and then outputs a signal. The first AND gate U3 has input terminals receiving a driving control signal DS and the signal output by the first NOT gate U5, performs "AND" operation on the received signals, and then outputs a first signal to a control terminal of the first switching device Q1. The second AND gate U4 has input terminals receiving the driving control signal DS and the comparison signal, performs "AND" operation on the received signals, and then outputs a second signal to a control terminal of the second switching device Q3. In the embodiment, the driving circuit may also include a second NOT gate U6. An input terminal of the second NOT gate U6 receives an original control signal DO. The second NOT gate U6 performs "NOT" operation on the original control signal DO and then outputs the driving control signal DS.

The first turn-off driving unit may include a first switching device Q1 and a first turn-off resistor Roff1. An input terminal of the first switching device Q1 is coupled with a first low potential −Vee1, and a control terminal of the first switching device Q1 receives a first signal output by the selection unit 202. A first terminal of the first turn-off resistor Roff1 is coupled with an output terminal of the first switching device Q1, and a second terminal of the first turn-off resistor Roff1 is coupled with a control terminal of the first semiconductor switch S1. In the embodiment, the switching devices in the driving circuit may include one or more of a MOSFET switch, an IGBT switch, a BJT switch and the like, and the MOSFET switch may include a Si MOSFET switch, a SiC MOSFET switch, a GaN MOSFET switch or the like.

The second turn-off driving unit may include a first turn-off resistor Roff1 and a second switching device Q3. An input terminal of the second switching device Q3 is coupled with a second low potential −Vee2, an output terminal of the second switching device Q3 is coupled with a first terminal of the first turn-off resistor Roff1, and a control terminal of the second switching device Q3 receives a second signal output by the selection unit 202. It shall be readily appreciated that although the second turn-off driving unit in the embodiment shares a part of components of the first turn-off driving unit, the first turn-off driving unit and the second turn-off driving unit may also be respectively independent circuits in other embodiments.

During usage, the comparison signal output by the first comparator U1 is a low level signal when the absolute value of the sampling current IS is larger than the reference value Ref; therefore, signals input to one input terminal of the first AND gate U3 and one input terminal of the second AND gate U4 are respectively a high level signal and a low level signal. In addition, when the driving control signal DS is a first control signal (a high level signal, for instance), the signals input to the other input terminal of the first AND gate U3 and the other input terminal of the second AND gate U4 are both high level signals. At this moment, the first signal output by the first AND gate U3 is a high level signal, and the second signal output by the second AND gate U4 is a low level signal. Therefore, the first switching device Q1 is switched on and the second switching device Q2 is turned off. The first turn-off driving unit turns off the first semiconductor switch S1 through the first turn-off resistor Roff1 and a first turn-off voltage (i.e., the voltage at the first low potential −Vee1). When the absolute value of the sampling current IS is smaller than or equal to the reference value Ref, the process is just opposite. Specifically, at this moment, the second switching device Q2 is switched on and the first switching device Q1 is turned off, and the second turn-off driving unit turns off the first semiconductor switch S1 through the first turn-off resistor Roff1 and a second turn-off voltage (i.e., the voltage at the second low potential −Vee2).

In the embodiment, the voltage value at the second low potential Vee2 is set to be larger than the voltage value at the first low potential Vee1, and thus, the turn-off speed may be improved and the switching loss may be reduced when the output current is smaller, and the turn-off speed may be decreased when the output current is larger. Consequently, the voltage stress requirements may be satisfied.

The turn-on driving unit may include a fourth switching device Q7 and a turn-on resistor Ron. An input terminal of the fourth switching device Q7 is coupled with a high potential +Vcc, and a control terminal of the fourth switching device Q7 receives a driving control signal DS. A first terminal of the on resistor Ron is coupled with an output terminal of the fourth switching device Q7, and a second terminal of the on resistor Ron is coupled with a control terminal of the first semiconductor switch S1. During usage, when the driving control signal DS is a second control signal (a low level signal, for instance), the fourth switching device Q7 is switched on, and the voltage at the control terminal of the semiconductor switch S1 is elevated; therefore, the first semiconductor switch S1 is switched on.

It should be noted that the driving circuit in the embodiment is used in the inverter circuit; however, it may also be applied in other circuits such as a DC conversion circuit or the like. The present embodiment does not impose specific limitations on this.

In the above embodiments, the number of the turn-off driving units is two. However, it shall be readily appreciated that more turn-off driving units may be included. In an embodiment, illustration will be made by taking an example where turn-off parameters in a driving circuit for a semiconductor switch are turn-off voltages of the turn-off driving units and the turn-off driving units include a first turn-off driving unit, a second turn-off driving unit and a third turn-off driving unit. A selection unit selects a turn-off driving unit having a turn-off voltage adaptive to the determined working state to turn off a semiconductor switch. For example, the turn-off voltages of the first turn-off driving unit, the second turn-off driving unit and the third turn-off driving unit rise in turn. The selection unit receives a first reference value and a second reference value larger than the first reference value, and compares the reference values with a sampling current IS: if the sampling current IS is larger than the second reference value, then the selection unit may select the first turn-off driving unit to turn off the semiconductor switch; if the sampling current IS is larger than the first reference value but smaller than or equal to the second reference value, then the selection unit may select the second turn-off driving unit to turn off the semiconductor switch; and if the sampling current IS is smaller than or equal to the first reference value, then the selection unit may select the third turn-off driving unit to turn off the semiconductor switch. More detailed descriptions will be given hereinafter with reference to FIG. 15.

Figure 15:
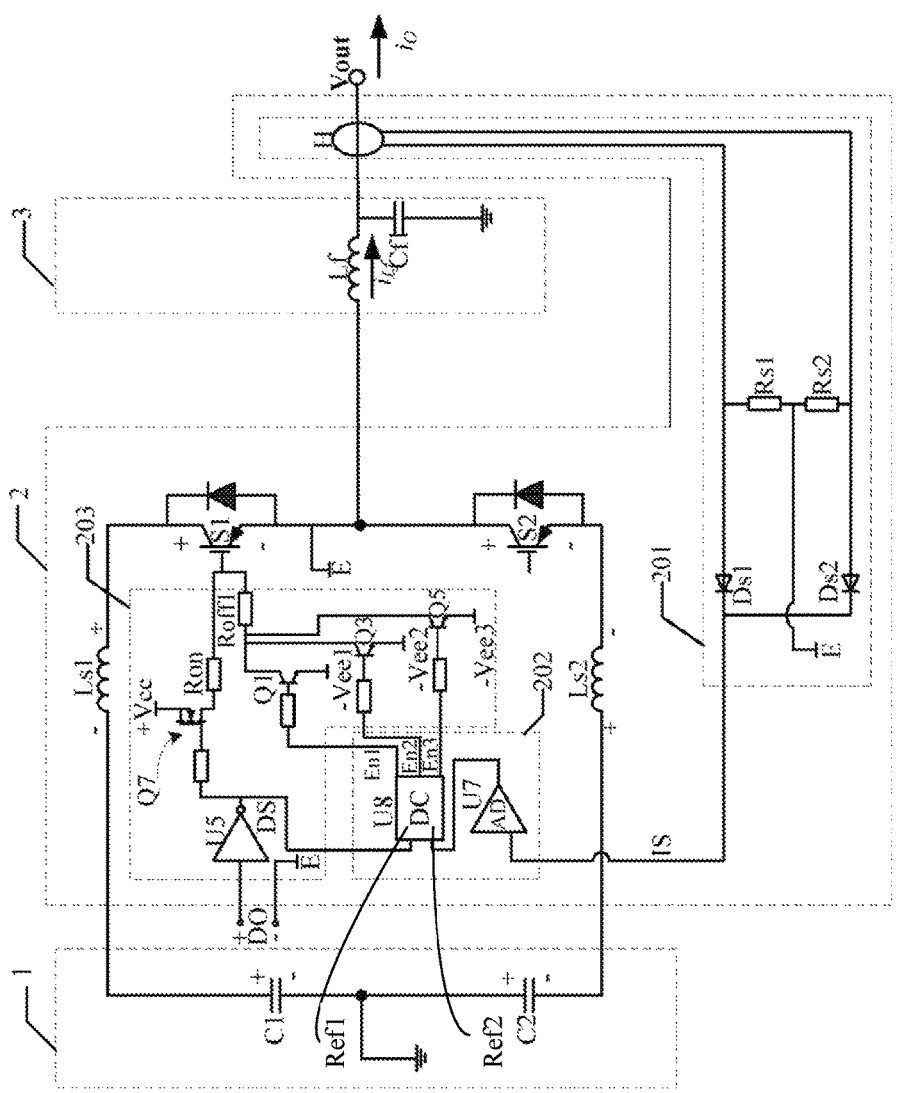
FIG. 15 is a block diagram showing a structure of a converter system according to an embodiment of the present disclosure.

As shown in FIG. 15, the driving circuit is applied in an inverter circuit. The structure of a main circuit module of the inverter circuit is similar to that of the main circuit module of the inverter circuit in the above embodiments. A control circuit module of the inverter circuit includes the driving circuit provided in the embodiment. The driving circuit mainly includes a sampling unit 201, a selection unit 202 and a driving unit 203. The driving unit 203 includes a first turn-off driving unit, a second turn-off driving unit, a third turn-off driving unit and a turn-on driving unit.

The sampling unit 201 may include current sampling elements such as a current transformer, a Hall element, a Rogowski coil or the like. In addition, such method as series sampling resistors may be employed, and alternatively, a voltage drop across a sampling device may be directly employed. A sampling current IS sampled by the sampling unit 201 is input to an input terminal of an analogue-to-digital converter U7 in the selection unit 202 which will be described below and is compared with a reference value by a comparator. In the embodiment, the implementation of the sampling unit 201 is similar to that in the above embodiments, which will not be repeatedly elaborated herein.

The first turn-off driving unit may include a first switching device Q1 and a first turn-off resistor Roff1. An input terminal of the first switching device Q1 is coupled with a first low potential −Vee1, and a control terminal of the first switching device Q1 receives a first signal output by the selection unit 202. A first terminal of the first turn-off resistor Roff1 is coupled with an output terminal of the first switching device Q1, and a second terminal of the first turn-off resistor Roff1 is coupled with a control terminal of the first semiconductor switch S1. In the embodiment, the switching devices in the driving circuit may include one or more of a MOSFET switch, an IGBT switch, a BJT switch and the like, and the MOSFET switch may include a Si MOSFET switch, a SiC MOSFET switch, a GaN Mosfet switch or the like.

The second turn-off driving unit may include a first turn-off resistor Roff1 and a second switching device Q3. The input terminal of the second switching device Q3 is coupled with a second low potential −Vee2. The potential at the second low potential −Vee2 in the embodiment is higher than the potential at the first low potential −Vee1. An output terminal of the second switching device Q3 is coupled with a first terminal of the first turn-off resistor Roff1, the second switching device Q3 has a control terminal receiving a second signal output by the selection unit 202 to turn on or off the second switching device Q3 according to the signal. It shall be readily appreciated that although the second turn-off driving unit in the embodiment shares a part of components of the first turn-off driving unit, the first turn-off driving unit and the second turn-off driving unit may also be respectively independent circuits in other embodiments.

The third turn-off driving unit may include the first turn-off resistor Roff1 and a third switching device Q5. An input terminal of the third switching device Q5 is coupled with a third low potential −Vee3. The potential at the third low potential −Vee3 in the embodiment is higher than the potential at the second low potential −Vee2. An output terminal of the third switching device Q5 is coupled with a first terminal of the first turn-off resistor Roff1, and the third switching device Q5 has a control terminal receiving a third signal output by the selection unit 202 to turn on or off the third switching device Q5 according to the signal. It shall be readily appreciated that although the third turn-off driving unit in the embodiment shares a part of components of the first turn-off driving unit and the second turn-off driving unit, the first turn-off driving unit, the second turn-off driving unit and the third turn-off driving unit may also be respectively independent circuits in other embodiments.

The selection unit 202 may include an analogue-to-digital converter U7 and a digital controller U8. The analogue-to-digital converter U7 has an input terminal receiving a sampling current IS, performs analogue-to-digital conversion on the sampling current IS and then outputs a digital signal. The digital controller U8 has input terminals receiving a driving control signal DS and the sampling current IS, performs operations and processes on the received digital signals and then outputs a first signal En1 to a control terminal of the first switching device Q1, or outputs a second signal En2 to a control terminal of the second switching device Q3, or outputs a third signal En3 to a control terminal of the third switching device Q5. In other embodiments, the digital controller U8 may also be substituted by an analog circuit device, which will not be elaborated in detail herein. In the embodiments, the driving circuit may also include a first NOT gate U5. The first NOT gate U5 has an input terminal receiving an original control signal DO. The first NOT gate U5 performs "NOT" operation on the original control signal DO and then outputs the driving control signal DS.

During usage, the digital controller U8 compares the sampling current IS with two different reference values which are set internally. In the embodiment, the reference values include a first reference value and a second reference value, and the first reference value is smaller than the second reference value. If the comparison result is that the sampling current IS is larger than the second reference value, then the digital controller U8 outputs a first signal (a high level signal, for instance) to a control terminal of the first switching device Q1 to drive the first switching device Q1 to be on, and thus the first semiconductor switch S1 is turned off through a first turn-off voltage (i.e., the voltage at the first low potential −Vee1). If the comparison result is that the sampling current IS is smaller than the second reference value but larger than the first reference value, then the digital controller U8 outputs a second signal (a high level signal, for instance) to a control terminal of the second switching device Q3 to drive the second switching device Q3 to be on, and thus the first semiconductor switch S1 is turned off through a second turn-off voltage (i.e., the voltage at the second low potential −Vee2). If the comparison result is that the sampling current IS is smaller than the first reference value, then the digital controller U8 outputs a third signal (a high level signal, for instance) to a control terminal of the third switching device Q5 to drive the third switching device Q5 to be on, and thus the first semiconductor switch S1 is turned off through a third turn-off voltage (i.e., the voltage at the third low potential −Vee3).

It should be noted that the driving circuit in the embodiment is used in the inverter circuit; however, it may also be applied in other circuits such as a DC conversion circuit or the like. The turn-off parameters of the driving circuit in the embodiment are the turn-off voltages; however, the turn-off parameters may also be other turn-off parameters such as the turn-off resistance, turn-off currents and the like. Moreover, although the driving circuit in the embodiment only has three turn-off driving units, more turn-off driving units may be included during practical applications. The present embodiment does not impose specific limitations on this.

Figure 16:
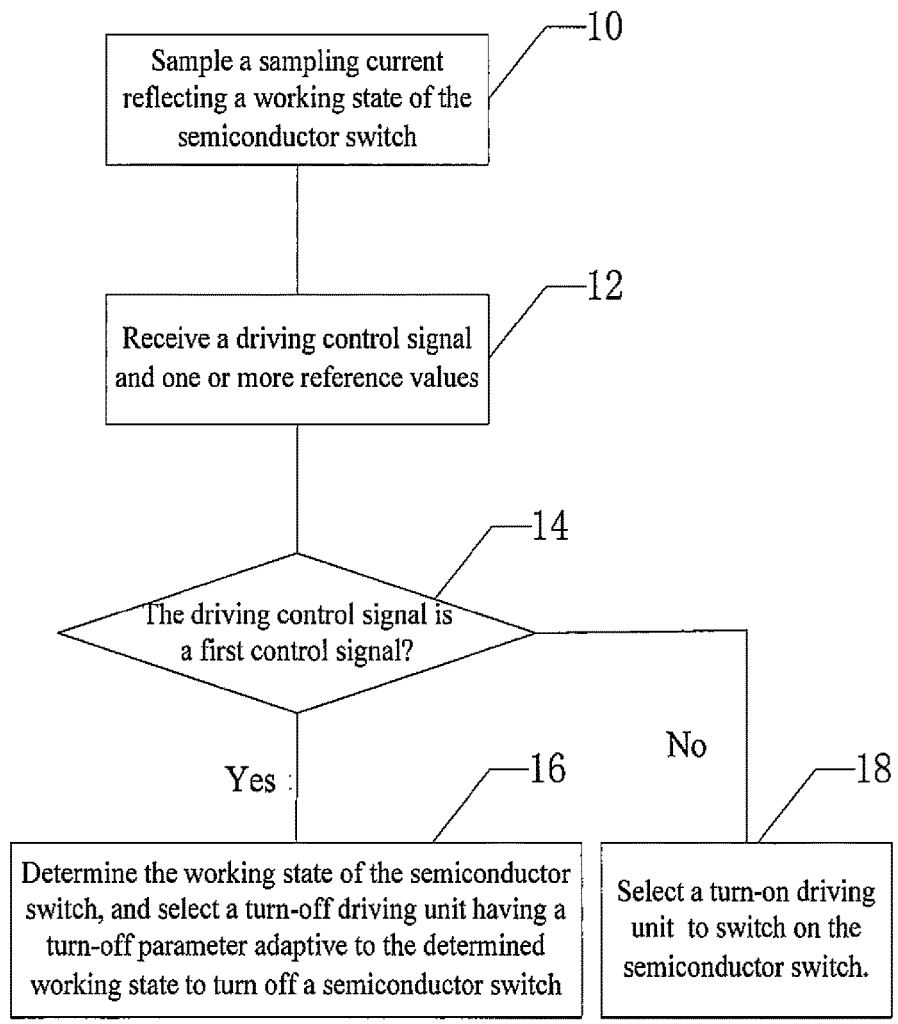
FIG. 16 is a flowchart showing a driving method for a semiconductor switch according to an embodiment of the present disclosure.

In an embodiment, there is provided a driving method for a semiconductor switch. The driving method is applied in the driving circuits as shown in FIGS. 6-15 which includes a plurality of turn-off driving units having different turn-off parameters and a turn-on driving unit. As shown in FIG. 16, the driving method may include the following steps.

In step S10, a sampling current reflecting a working state of the semiconductor switch is sampled. In other embodiments, the method may further include step of rectifying the sampled current to obtain the sampling current.

In step S12, a driving control signal and one or more reference values are received.

In step S14, whether the driving control signal is a first control signal or a second control signal is determined: when the driving control signal is the first control signal, step S16 is performed, and when the driving control signal is the second control signal, step S18 is performed.

In step S16, the working state of the semiconductor switch is determined according to the sampling current and the reference values, and a turn-off driving unit having a turn-off parameter adaptive to the determined working state is selected to turn off a semiconductor switch.

In step S18, a turn-on driving unit is selected to switch on the semiconductor switch.

When the driving circuit includes a first turn-off driving unit to an M-th turn-off driving unit having turn-off speeds decreasing in turn, selecting a turn-off driving unit having a turn-off parameter adaptive to the determined working state to turn off the semiconductor switch may include:

comparing the sampling current with a first reference value to an M-th reference value rising in turn, and performing one of the following steps according to the comparison result:

if the sampling current is not larger than the first reference value, then selecting the first turn-off driving unit to turn off the semiconductor switch;

if the sampling current is larger than an N-th reference value but not larger than an (N+1)-th reference value, then selecting an (N+1)-th turn-off driving unit to turn off the semiconductor switch, wherein 1≤N≤M−1; and if the sampling current is larger than the (M−1)-th reference value, then selecting the M-th turn-off driving unit to turn off the semiconductor switch.

Figure 17:
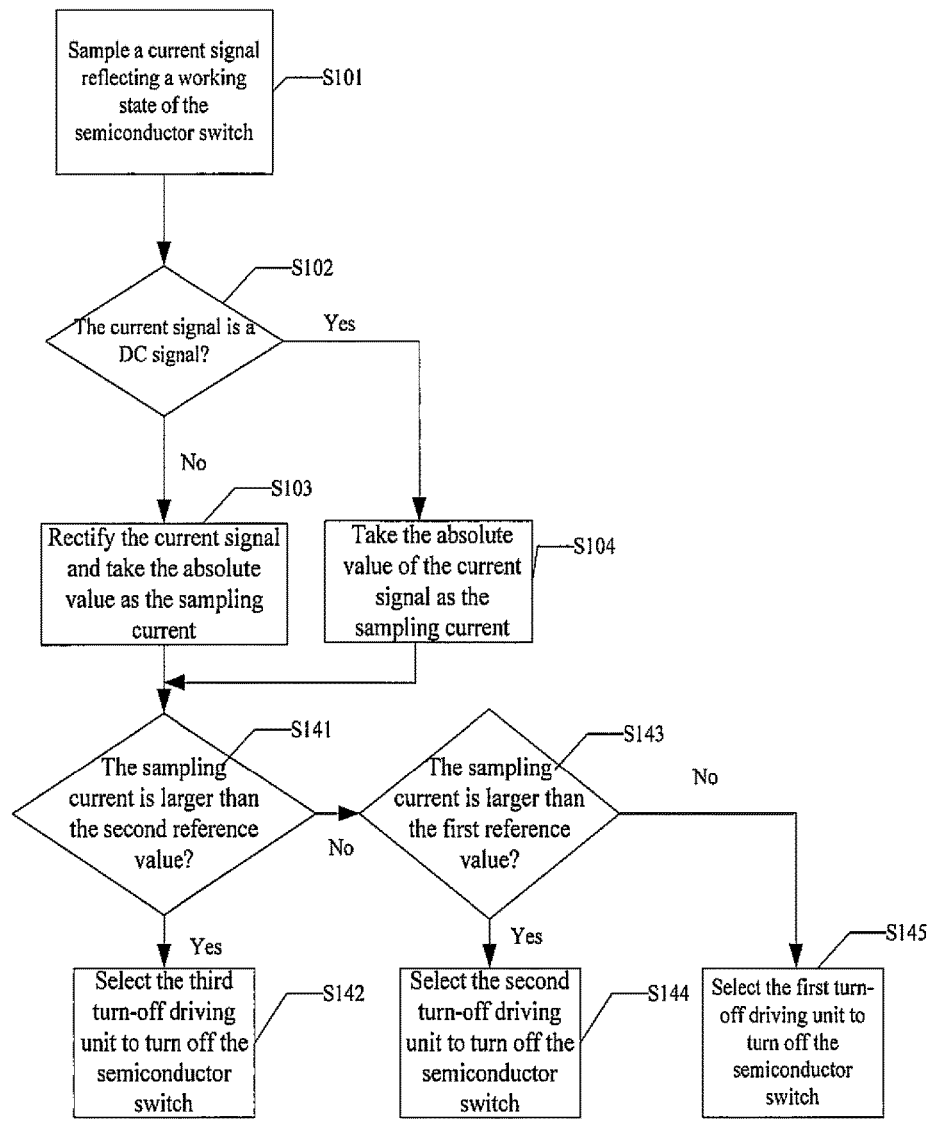
FIG. 17 is a flowchart showing another driving method for a semiconductor switch according to an embodiment of the present disclosure.

FIG. 17 is a flowchart of an embodiment of a driving method for a semiconductor switch, wherein M=3 and the driving control signal in step S12 is the first control signal. The driving method may include the following steps.

In step S101, a current signal reflecting a working state of the semiconductor switch is sampled.

In step S102, whether the current signal sampled in step S101 is a DC signal is determined:

if the current signal is not a DC signal, then step S103 is performed; if the current signal is a DC signal, then step S104 is performed.

In step S103, the current signal sampled in step S101 is rectified, and the absolute value of the rectified current signal serves as a sampling current.

In step S104, the absolute value of the current signal sampled in step S101 serves as a sampling current.

In step S141, whether the sampling current is larger than a second reference value is determined:

if the sampling current is larger than the second reference value, then step S142 is performed; if the sampling current is smaller than or equal to the second reference value, then step S143 is performed.

In step S142, a third turn-off driving unit is selected to turn off the semiconductor switch. The third turn-off driving unit has a relatively slow turn-off speed, and thus it is guaranteed that the voltage stress requirements of the semiconductor switch is met under a larger current.

In step S143, whether the sampling current is larger than a first reference value is determined:

if the sampling current is larger than the first reference value, then step S144 is performed; if the sampling current is smaller than or equal to the first reference value, then step S145 is performed.

In step S144, a second turn-off driving unit is selected to turn off the semiconductor switch. The second turn-off driving unit has a moderate turn-off speed, and thus a smaller turn-off loss may be obtained and meanwhile the requirements of the voltage stress of the semiconductor switch can be met.

In step S145, a first turn-off driving unit is selected to turn off the semiconductor switch. The first turn-off driving unit has a relatively fast turn-off speed, and thus the turn-off loss may be further reduced, and meanwhile the voltage stress requirements of the semiconductor switch may be met.

With regard to the driving method in the foregoing embodiments, specific manners for performing each step have been described in detail in relevant embodiment of the driving circuit, which thus will not be repeatedly elaborated herein.

The present disclosure has been described in the foregoing related embodiments. However, the foregoing embodiments are examples for implementing the present disclosure merely. It should be noted that the disclosed embodiments are not for limiting the scope of the present disclosure. Instead, alternations and modifications not departing from the spirit and scope of the present disclosure fall within the protection scope of the present disclosure.

What is claimed is:

1. A driving circuit for driving a semiconductor switch in a converter, comprising:
   a driving unit comprising a plurality of turn-off driving units with different turn-off parameters and a turn-on driving unit;
   a sampling unit configured to sample an output current of the converter as a sampling current; and
   a selection unit receiving a driving control signal, the sampling current and one or more reference values, determining a working state of the semiconductor switch according to the sampling current and the reference values when the driving control signal is a first control signal, and selecting a turn-off driving unit with a turn-off parameter adaptive to the working state to turn off the semiconductor switch; and selecting the turn-on driving unit to turn on the semiconductor switch when the driving control signal is a second control signal;
   wherein the turn-off parameters are turn-off currents of the turn-off driving unit, wherein the turn-off driving units comprise a first turn-off driving unit and a second turn-off driving unit, and a turn-off current of the first turn-off driving unit is smaller than that of the second turn-off driving unit; and
   the selection unit receives one of the reference values and compares the received reference value with the sampling current: if the sampling current is larger than the reference value, the first turn-off driving unit is selected to turn off the semiconductor switch; and if the sampling current is smaller than or equal to the reference value, the second turn-off driving unit is selected to turn off the semiconductor switch;
   wherein the second turn-off driving unit comprises:
   a first switching device having an input terminal coupled with a low potential, and a control terminal receiving the driving control signal to turn on the first switching device when the driving control signal is the first control signal;
   a turn-off resistor having a first terminal coupled with an output terminal of the first switching device, and a second terminal coupled with a control terminal of the semiconductor switch;
   a coupling capacitor having a first terminal receiving an output signal from the selection unit;
   a first resistor having a first terminal coupled with a second terminal of the coupling capacitor, and a second terminal coupled with a reference ground;
   a first comparator having input terminals coupled with the first terminal of the first resistor and a reference ground, respectively, and outputting a first comparison signal according to a comparison result of the potential at the first terminal of the first resistor and the potential at the reference ground;
a second resistor having a first terminal coupled with the low potential; and
a second switching device having an input terminal coupled with a second terminal of the second resistor, an output terminal coupled with the control terminal of the semiconductor switch, and a control terminal receiving the first comparison signal to turn on or off the second switching device according to the first comparison signal.

2. The driving circuit according to claim 1, wherein the first turn-off driving unit comprises:
a first switching device having an input terminal coupled with a low potential, and a control terminal receiving the driving control signal to turn on the first switching device when the driving control signal is the first control signal; and
a turn-off resistor having a first terminal coupled with an output terminal of the first switching device, and a second terminal coupled with a control terminal of the semiconductor switch.

3. The driving circuit according to claim 1, wherein the selection unit comprises:
a second comparator receiving and comparing the sampling current and the reference value, and outputting a second comparison signal according to the sampling current and the reference value; and
an AND gate receiving the driving control signal and the second comparison signal, performing AND operation on the driving control signal and the second comparison signal to output a signal to the turn-off driving units.

4. The driving circuit according to claim 1, wherein the turn-on driving unit comprises:
a fourth switching device having an input terminal coupled with a high potential, and a control terminal receiving the driving control signal to turn on the fourth switching device when the driving control signal is a second control signal; and
a turn-on resistor having a first terminal coupled an output terminal of the fourth switching device, and a second terminal coupled with a control terminal of the semiconductor switch.

5. A driving method for driving a semiconductor switch in a converter, employing a driving circuit comprising a plurality of turn-off driving units with different turn-off parameters and a turn-on driving unit:
wherein the method comprises:
sampling an output current of the converter as a sampling current; and
receiving a driving control signal and one or more reference values, when the driving control signal is a first control signal, determining a working state of the semiconductor switch according to the sampling current and the reference values, and selecting a turn-off driving unit with a turn-off parameter adaptive to the determined working state to turn off the semiconductor switch; and when the driving control signal is a second control signal, selecting the turn-on driving unit to switch on the semiconductor switch;
wherein the driving circuit comprises a first turn-off driving unit to an M-th turn-off driving unit which have turn-off speeds decreasing in turn;
the driving method further comprises:
comparing the sampling current with a first reference value to an (M−1)-th reference value in turn, and then performing one of the following steps:
if the sampling current is not larger than the first reference value, selecting the first turn-off driving unit to turn off the semiconductor switch;
if the sampling current is larger than an N-th reference value but not larger than an (N+1)-th reference value, selecting an (N+1)-th turn-off driving unit to turn off the semiconductor switch, wherein 1≤N≤M−1; and
if the sampling current is larger than the (M−1)-th reference value, selecting the M-th turn-off driving unit to turn off the semiconductor switch.

6. A driving circuit for a semiconductor switch, comprising:
a driving unit comprising a plurality of turn-off driving units with different turn-off parameters and a turn-on driving unit;
a sampling unit configured to sample a sampling current reflecting a working state of the semiconductor switch; and
a selection unit receiving a driving control signal, the sampling current and one or more reference values, determining the working state of the semiconductor switch according to the sampling current and the reference values when the driving control signal is a first control signal, and selecting a turn-off driving unit with a turn-off parameter adaptive to the working state to turn off the semiconductor switch; and selecting the turn-on driving unit to turn on the semiconductor switch when the driving control signal is a second control signal;
wherein the turn-off parameters are turn-off voltages of the turn-off driving units, wherein the turn-off driving units comprise a first turn-off driving unit and a second turn-off driving unit, and a turn-off voltage of the first turn-off driving unit is lower than that of the second turn-off driving unit; and
the selection unit receives one of the reference values and compares the received reference value with the sampling current: if the sampling current is larger than the reference value, the first turn-off driving unit is selected to turn off the semiconductor switch; and if the sampling current is smaller than or equal to the reference value, the second turn-off driving unit is selected to turn off the semiconductor switch;
wherein the selection unit comprises:
a comparator receiving and comparing the sampling current and the reference value, and outputting a comparison signal according to the sampling current and the reference value; and
a first NOT gate receiving the comparison signal, and performing NOT operation on the comparison signal and then outputting a signal;
a first AND gate receiving the driving control signal and the signal output by the first NOT gate, and performing AND operation on the driving control signal and the signal output by the first NOT gate to output a first signal to the turn-off driving units; and
a second AND gate receiving the driving control signal and the comparison signal, and performing AND operation on the driving control signal and the comparison signal to output a second signal to the turn-off driving units.

7. A driving circuit for a semiconductor switch, comprising:

a driving unit comprising a plurality of turn-off driving units with different turn-off parameters and a turn-on driving unit;

a sampling unit configured to sample a sampling current reflecting a working state of the semiconductor switch; and a selection unit receiving a driving control signal, the sampling current and one or more reference values, determining the working state of the semiconductor switch according to the sampling current and the reference values when the driving control signal is a first control signal, and selecting a turn-off driving unit with a turn-off parameter adaptive to the working state to turn off the semiconductor switch; and selecting the turn-on driving unit to turn on the semiconductor switch when the driving control signal is a second control signal;

wherein the turn-off driving units comprise a first turn-off driving unit, a second turn-off driving unit and a third turn-off driving unit which have turn-off voltages rising in turn;

the selection unit receives a first reference value and a second reference value larger than the first reference value, and compares the first reference value and the second reference value with the sampling current;

if the sampling current is larger than the second reference value, the first turn-off driving unit is selected to turn off the semiconductor switch;

if the sampling current is larger than the first reference value but not larger than the second reference value, the second turn-off driving unit is selected to turn off the semiconductor switch; and if the sampling current is not larger than the first reference value, the third turn-off driving unit is selected to turn off the semiconductor switch.

8. The driving circuit according to claim 7, wherein the first turn-off driving unit comprises:

a first switching device having an input terminal coupled with a first low potential, and a control terminal receiving a first signal output by the selection unit to turn on or off the first switching device according to the first signal; and a turn-off resistor having a first terminal coupled with an output terminal of the first switching device, and a second terminal coupled with a control terminal of the semiconductor switch.

9. The driving circuit according to claim 7, wherein the second turn-off driving unit comprises:

a turn-off resistor having a second terminal coupled with a control terminal of the semiconductor switch; and a second switching device having an input terminal coupled with a second low potential, an output terminal coupled with a first terminal of the turn-off resistor, and a control terminal receiving a second signal output by the selection unit to turn on or off the second switching device according to the second signal.

10. The driving circuit according to claim 7, wherein the third turn-off driving unit comprises:

a turn-off resistor having a second terminal coupled with a control terminal of the semiconductor switch; and a third switching device having an input terminal coupled with a third low potential, an output terminal coupled with a first terminal of the turn-off resistor, and a control terminal receiving a third signal output by the selection unit to turn on or off the third switching device according to the third signal.

11. The driving circuit according to claim 7, wherein the selection unit comprises:

an analogue-to-digital converter having an input terminal receiving the sampling current, and performing analogue-to-digital conversion on the sampling current and then outputting a digital signal; and a digital controller having input terminals receiving the driving control signal and the digital signal, performing operation on the driving control signal and the digital signal and then outputting a first signal, a second signal and a third signal to the turn-off driving units.

* * * * *